US012588569B2

(12) United States Patent
Zhang et al.

(10) Patent No.: US 12,588,569 B2
(45) Date of Patent: Mar. 24, 2026

(54) BURIED SEAM WITH KIRIGAMI PATTERN FOR 3D MICRO LED DISPLAY

(71) Applicant: Apple Inc., Cupertino, CA (US)

(72) Inventors: Zhen Zhang, Sunnyvale, CA (US); Kapil V. Sakariya, Los Altos, CA (US); Waldemar J. Siskens, Palo Alto, CA (US); Han-Chieh Chang, Taipei (TW); Xia Li, San Jose, CA (US); Yong Sun, San Jose, CA (US); Izhar Z. Ahmed, Saratoga, CA (US); Bulong Wu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 385 days.

(21) Appl. No.: 18/551,374

(22) PCT Filed: Mar. 22, 2022

(86) PCT No.: PCT/US2022/021327
§ 371 (c)(1),
(2) Date: Sep. 19, 2023

(87) PCT Pub. No.: WO2022/212125
PCT Pub. Date: Oct. 6, 2022

(65) Prior Publication Data
US 2024/0170471 A1      May 23, 2024

Related U.S. Application Data

(60) Provisional application No. 63/319,536, filed on Mar. 14, 2022, provisional application No. 63/168,930, filed on Mar. 31, 2021.

(51) Int. Cl.
*H01L 25/075*      (2006.01)
*H01L 25/16*      (2023.01)
(Continued)

(52) U.S. Cl.
CPC ........ *H01L 25/167* (2013.01); *H01L 25/0753* (2013.01); *H10D 86/441* (2025.01);
(Continued)

(58) Field of Classification Search
CPC . H01L 25/167; H01L 25/0753; H10D 86/441; H10D 86/60; H10D 86/451; H10H 20/821; H10H 20/857; H10H 29/142
See application file for complete search history.

(56) References Cited

U.S. PATENT DOCUMENTS 5,789,766 A * 8/1998 Huang ................. H10H 29/142
257/83
9,899,418 B2* 2/2018 Pfeuffer ............. H10D 86/0223
(Continued)

FOREIGN PATENT DOCUMENTS

KR      2020-0074591 A      6/2020

OTHER PUBLICATIONS

PCT/US2022/021327, "PCT Notification of Transmittal of the International Search Report and the Written Opinion of the International Searching Authority, or the Declaration" mailed Jul. 8, 2022, 8 pages.

*Primary Examiner* — Eugene Lee
(74) *Attorney, Agent, or Firm* — Aikin & Gallant, LLP

(57)      ABSTRACT

Display structures and methods of assembly are described. In an embodiment, a display structure includes a display panel including a pattern of trenches extending at least partially through a backplane of the display panel, without extending past a matrix of LEDs in an overlying emission layer stack. The plurality of trenches can be formed in 2D to facilitate bending of the display panel into a 3D film curvature.

29 Claims, 25 Drawing Sheets

(51) Int. Cl.

| | | |
|---|---|---|
| *H10D 86/40* | (2025.01) | |
| *H10D 86/60* | (2025.01) | |
| *H10H 20/821* | (2025.01) | |
| *H10H 20/857* | (2025.01) | |
| *H10H 29/14* | (2025.01) | |

(52) U.S. Cl.
CPC .......... *H10D 86/60* (2025.01); *H10H 20/821* (2025.01); *H10H 20/857* (2025.01); *H10H 29/142* (2025.01)

(56)     References Cited

U.S. PATENT DOCUMENTS

| | | | | |
|---|---|---|---|---|
| 10,461,120 | B2 * | 10/2019 | von Malm | ............. H10D 86/60 |
| 2016/0035924 | A1 | 2/2016 | Oraw et al. | |
| 2016/0231784 | A1 | 8/2016 | Yu et al. | |
| 2017/0294417 | A1 * | 10/2017 | Edmond | ............. H10H 29/142 |
| 2019/0096864 | A1 | 3/2019 | Huitema et al. | |
| 2020/0395403 | A1 | 12/2020 | Ahmed et al. | |
| 2022/0068873 | A1 * | 3/2022 | Yuan | ...................... H01L 24/81 |
| 2022/0093579 | A1 * | 3/2022 | Kishimoto | .......... H10H 20/018 |
| 2022/0189931 | A1 * | 6/2022 | Hwang | ............... H10H 20/851 |
| 2022/0285326 | A1 * | 9/2022 | Oh | ...................... H10H 20/018 |
| 2023/0359296 | A1 * | 11/2023 | Wu | ...................... H10D 86/451 |

* cited by examiner

BURIED SEAM WITH KIRIGAMI PATTERN FOR 3D MICRO LED DISPLAY

CROSS-REFERENCE TO RELATED APPLICATIONS

This patent application is a U.S. National Phase Application under 35 U.S.C. § 371 of International Application No. PCT/US2022/021327, filed Mar. 22, 2022, entitled "Buried Seam With Kirigami Pattern for 3D Micro LED Display", which claims the benefit of priority of U.S. Provisional Application No. 63/319,536, filed Mar. 14, 2022 and claims the benefit of priority of U.S. Provisional Application No. 63/168,930, filed Mar. 31, 2021, both of which are incorporated herein by reference.

BACKGROUND

Field

Embodiments described herein relate to display systems.

Background Information

State of the art displays for electronic devices such as wearable devices, portable electronics, desktop computers, and televisions are based on liquid crystal display (LCD) or organic light emitting diodes (OLED) technologies. More recently, it has been proposed to incorporate emissive inorganic semiconductor-based micro LEDs into high resolution displays, with the potential for energy efficiency and being less prone to lifetime degradation and sensitivity to moisture.

Display panel edges have traditionally included a non-display area along sides of the display panel to accommodate connection of components associated with the display panel function. A current trend is the drive to reduced edge areas to maximize display area size of the display panel. This can be attributed to both aesthetic appeal and the incorporation of touch interfaces. Even more recently, it has been proposed to expand the display area over a curved edge of a device. In one implementation, a display panel includes a curved two-dimensional film, or 2.5D film contour that is curved about an axis near an edge of the display panel.

SUMMARY

Embodiments describe display structure configurations and assembly sequences to form display structures with three-dimensional (3D) compound film curvature. In particular embodiments describe the formation of a pattern of trenches that extend at least partially through a backplane of a display panel without extending past a matrix of LEDs in an overlying emission stack layer of the display panel. The plurality of trenches can be formed in 2D to facilitate subsequent bending/molding of the display panel into a 3D film curvature. The trench patterns in accordance with embodiments may be also referred to as kirigami patterns, or cuts, that facilitate bending/molding. In accordance with embodiments the trenches may be buried within the display panel, and as a result not visible from the display area side of the display panel visible to a user.

DETAILED DESCRIPTION

Figure 1:
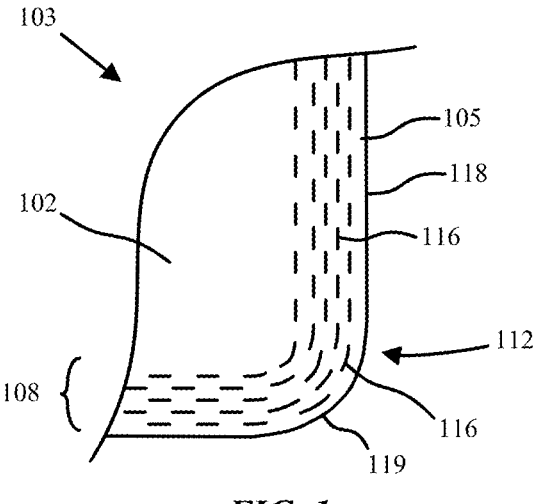
FIG. 1 is a schematic top-down view illustration of a display panel including a main body area and a pattern of trenches in an edge area of the display panel in accordance with an embodiment.

Embodiments describe display panel configurations and manufacturing techniques to form display panel areas with three-dimensional (3D) compound film curvature. In particular, embodiments describe display panel cut and molding concepts to facilitate molding (e.g. stretching, impressing, folding) of a 2D display panel film into a 3D compound film curvature, for example along corners or a dome shaped display.

In an embodiment, a display structure includes a display panel which includes a display area spanning across a main body area and an edge area around the main body area of the display panel. The display panel may include a multilayer stack-up, including a backplane and emission layer stack spanning over the backplane. The backplane may include LED driver circuitry (e.g. pixel circuitry), and the emission layer stack may include a matrix of LEDs (e.g. micro LEDs) dispersed across the display area and electrically connected with the LED driver circuitry. A pattern of trenches can extend at least partially through the backplane in the edge area of the display panel without extending into the upper emission layer stack. The main body area in accordance with embodiments can be flat, dome shaped or curved with a 2.5D curvature. The trenches may be formed by one or more cutting techniques such as laser cutting, patterning and etching, or alternatively be pre-patterned. The display panel can then be molded or stretched in into a 3D compound film curvature. In particular, a kirgami pattern of trenches can facilitate the panel stretching while producing no visible seam since the trenches are confined to buried layers in the display panel stack-up.

In one aspect, embodiments describe solutions for integrating traditional 2D display panel architectures into a molded 3D compound film curvature. The trenches may be arranged in a kirigami pattern along the display area edge area and/or inside the main body area of the display area, to increase stretchability of the display panel. Such a design allows for lamination of the display panel into a 3D compound film curvature while alleviating strain within the display panel.

In accordance with embodiments, the trenches are not formed through the entire display panel, and can be buried underneath the emission layer stack. In an embodiment, the emission layer stack may include a continuous black matrix layer directly over the trenches and around the micro LEDs. This can obscure seam/trench visibility and increase optical brightness with the same power. Additionally, a polarizer layer may not be needed to visually obscure the seams from a user, further increasing efficiency of the display panel. Furthermore, since the trenches can be buried beneath the micro LEDs, the trenches do not directly impact (pixel) density of the display panel. In some embodiments, the trenches can be arranged between matrix tiles to avoid fan-out routing lines, or even between micro LEDs within a street width within a pixel or between pixels. In some embodiments a decoupling layer is integrated into the backplane. The decoupling layer may have a tuned effective modulus and thickness to provide decouple stress near the pixel driver chips that can result from trench formation and stretching or bending the display panel into a 3D compound film curvature.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 2:
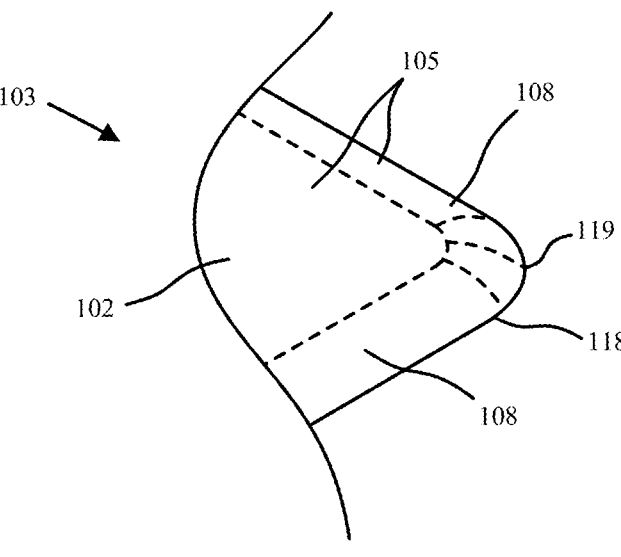
FIG. 2 is a perspective view illustration of a display panel bent in a curved three-dimensional (3D) film contour in accordance with an embodiment.

Referring now to FIGS. 1-2, FIG. 1 is a schematic top-down view illustration of a display panel 103 including a main body area 102 and an edge area 108 extending from and surrounding the main body area 102 in accordance with an embodiment; FIG. 2 is a perspective view illustration of a display panel 103 including an edge area 108 molded/bent in a curved 3D film contour in accordance with an embodiment. More specifically, FIG. 2 is an illustration of curved edge areas 108 after molding a flat pre-cut or pre-patterned display panel 103 such as that illustrated in FIG. 1.

As shown in both FIGS. 1-2, a kirigami pattern 112 of trenches 116 is formed partially through a thickness of the display panel 103 to facilitate molding (e.g. stretching, impressing, folding) into the curved 3D film contour. In this manner, the display area 105 of the display panel 103 can extend near the edges 118 of the display panel 103, along the curved edge areas 108 and within the curved 3D film contour. In accordance with embodiments the main body area 102 may be flat or curved, and may be surrounded by curved edge areas 108. Edge areas 108 may also include a curved 2D film contour, for example, along straight edges of a display panel between corners 119.

Figure 3:
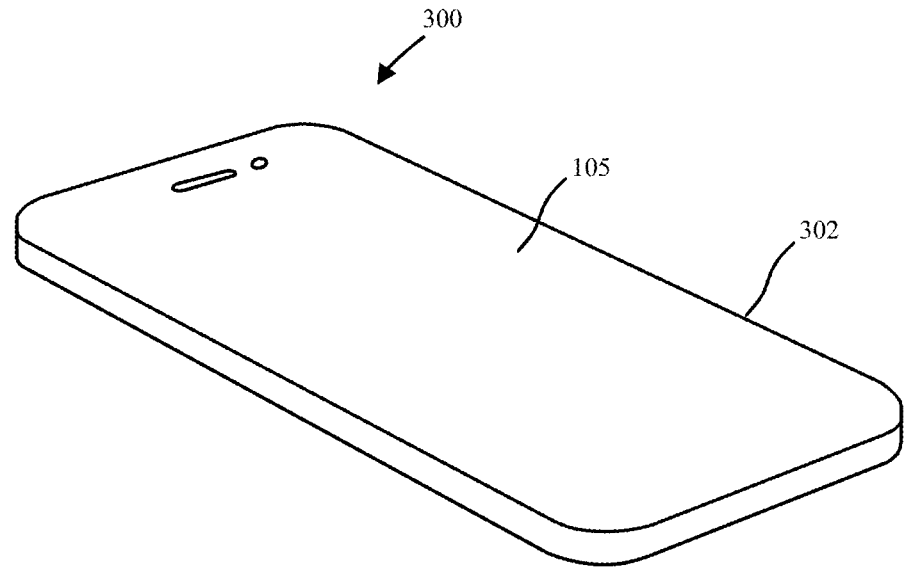
FIG. 3 is an isometric view of a mobile telephone in accordance with an embodiment.
Figure 4:
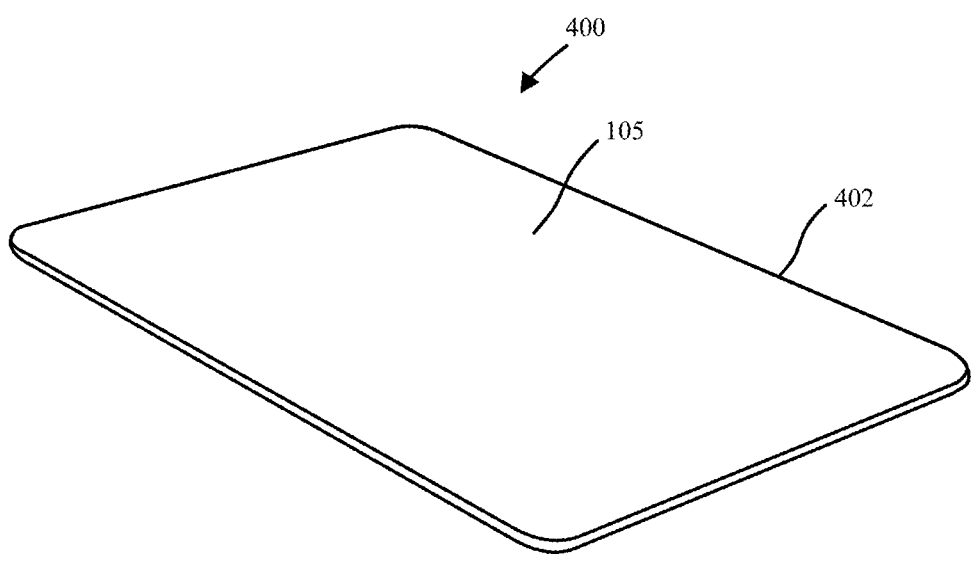
FIG. 4 is an isometric view of a tablet computing device in accordance with an embodiment.
Figure 5:
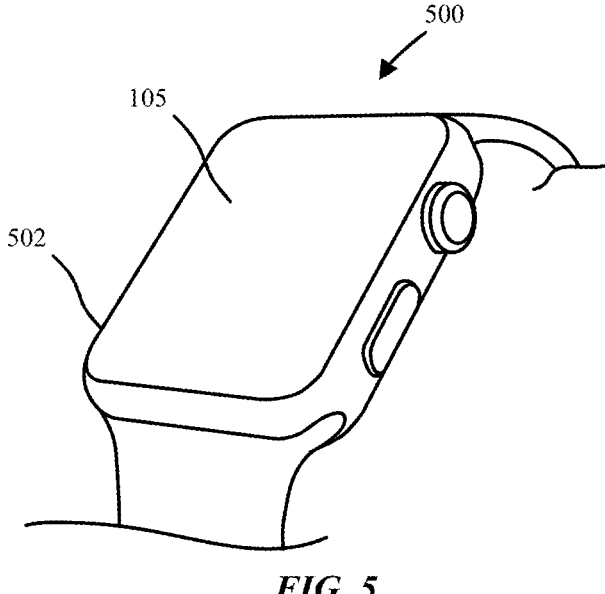
FIG. 5 is an isometric view of a wearable device in accordance with an embodiment.
Figure 6:
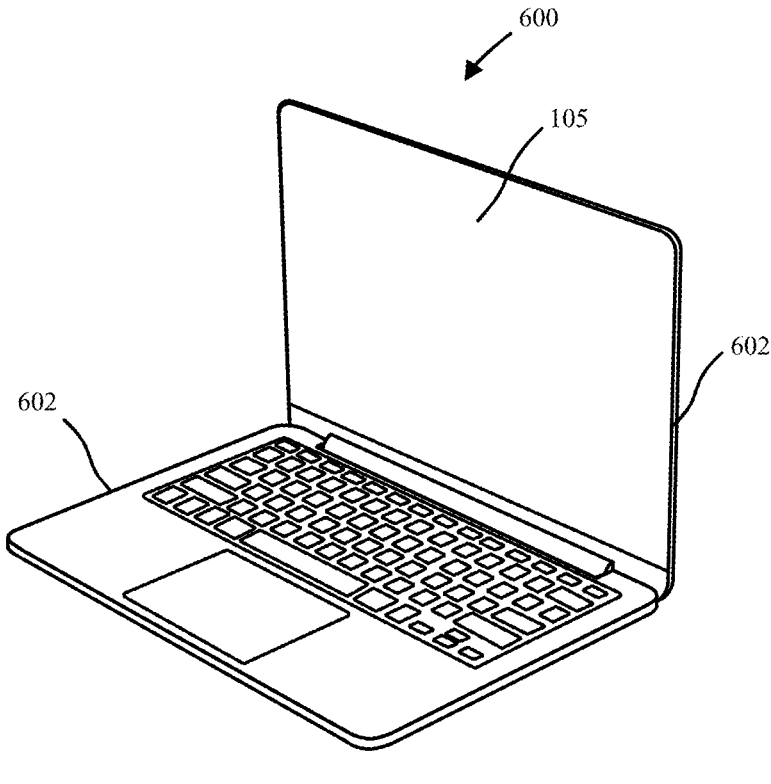
FIG. 6 is an isometric view of a laptop computer in accordance with an embodiment.

FIGS. 3-6 illustrate various portable electronic systems in which the various embodiments can be implemented. FIG. 3 illustrates an exemplary mobile telephone 300 that includes a display structure including a display area 105 packaged in a housing 302. FIG. 4 illustrates an exemplary tablet computing device 400 that includes a display structure including a display area 105 packaged in a housing 402. FIG. 5 illustrates an exemplary wearable device 500 that includes a display structure including a display area 105 packaged in a housing 502. FIG. 6 illustrates an exemplary laptop computer 600 that includes a display structure including a display area 105 packaged in a housing 602. In each embodiment, the display structure can have a display area 105 with a curved three-dimensional (3D) film contour.

Figure 7:
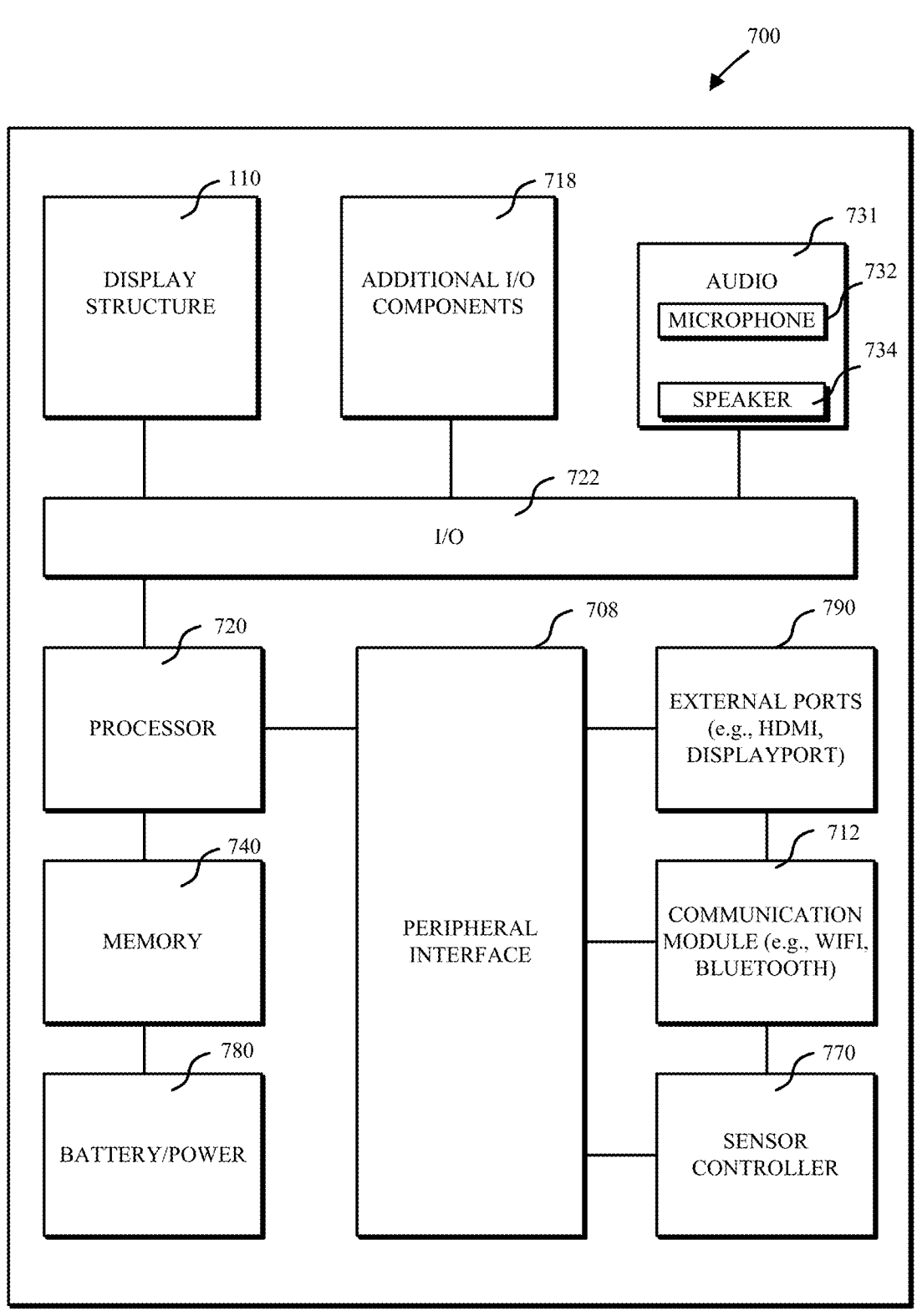
FIG. 7 is a system diagram of a portable electronic device in accordance with an embodiment.

FIG. 7 illustrates a system diagram for an embodiment of a portable electronic device 700 including a display structure 110 described herein. The portable electronic device 700 includes a processor 720 and memory 740 for managing the system and executing instructions. The memory includes non-volatile memory, such as flash memory, and can additionally include volatile memory, such as static or dynamic random access memory (RAM). The memory 740 can additionally include a portion dedicated to read only memory (ROM) to store firmware and configuration utilities.

The system also includes a power module 780 (e.g., flexible batteries, wired or wireless charging circuits, etc.), a peripheral interface 708, and one or more external ports 790 (e.g., Universal Serial Bus (USB), HDMI, Display Port, and/or others). In one embodiment, the portable electronic device 700 includes a communication module 712 configured to interface with the one or more external ports 790. For example, the communication module 712 can include one or more transceivers functioning in accordance with IEEE standards, 3GPP standards, or other communication standards, 4G, 5G, etc. and configured to receive and transmit data via the one or more external ports 790. The communication module 712 can additionally include one or more WWAN transceivers configured to communicate with a wide area network including one or more cellular towers, or base stations to communicatively connect the portable electronic device 700 to additional devices or components. Further, the communication module 712 can include one or more WLAN and/or WPAN transceivers configured to connect the portable electronic device 700 to local area networks and/or personal area networks, such as a Bluetooth network.

The portable electronic device 700 can further include a sensor controller 770 to manage input from one or more sensors such as, for example, proximity sensors, ambient light sensors, or infrared transceivers. In one embodiment the system includes an audio module 731 including one or more speakers 734 for audio output and one or more microphones 732 for receiving audio. In embodiments, the speaker 734 and the microphone 732 can be piezoelectric components. The portable electronic device 700 further includes an input/output (I/O) controller 722, a display structure 110, and additional I/O components 718 (e.g., keys, buttons, lights, LEDs, cursor control devices, haptic devices, and others). The display structure 110 and the additional I/O components 718 may be considered to form portions of a user interface (e.g., portions of the portable electronic device 700 associated with presenting information to the user and/or receiving inputs from the user).

Figures 8A, 8B:
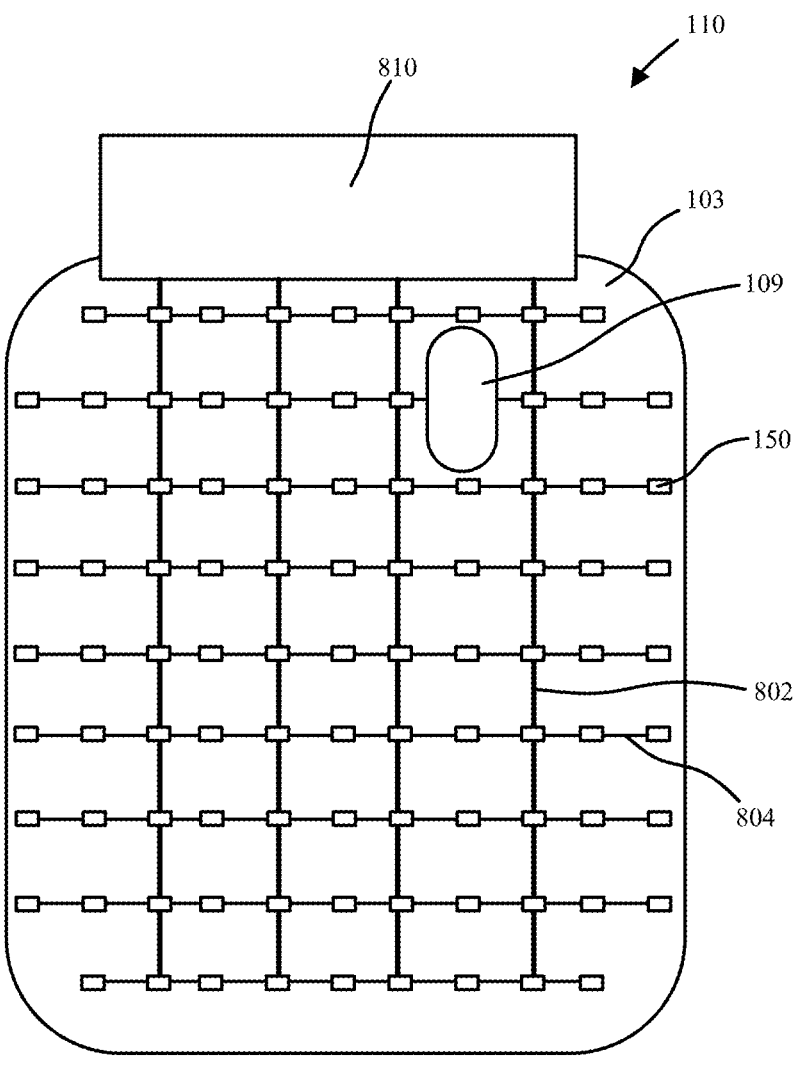
FIG. 8A is schematic top view illustration of a tile-based display structure including a display panel with a cutout and rounded corners in accordance with an embodiment.
FIG. 8B is a schematic top view illustration of a matrix tile including a pixel driver chip to switch and drive multiple pixels of LEDs in accordance with an embodiment.

FIG. 8A is schematic top view illustration of a display structure 110 including a tile-based display panel 103 with a cutout 109 and rounded corners 119 in accordance with an embodiment. For example, the edge areas 108 near corners 119 can be molded into a curved 3D film contour. The tile-based display panels may include an arrangement of pixel driver chips 150 to drive local matrices of pixels. FIG. 8B is an example of a matrix tile 155 including a pixel driver chip 150 coupled to a micro-matrix of LEDs 104 (e.g. micro LEDs). Each pixel diver chip 150 may switch and drive multiple pixels 107 of LEDs 104 within the micro-matrix of LEDs 104. This may include either a direct drive approach, where every pin of the pixel driver chip 150 is connected to one LED, or a local passive matrix (LPM) arrangement in which pins of the pixel driver chips 150 can be connected to strings of LEDs. In an embodiment, this may be an LPM matrix tile 155. LPM arrangements in accordance with embodiments may significantly reduce the silicon area associated with the pixel drivers, and the peak panel current. In some embodiments the pixel driver chips are distributed between LEDs. Such a configuration may include pixel driver chips 150 being laterally between LEDs 104 on the same side of the display panel. Depending upon complexity, the pixel driver chips may be longer than the corresponding LED matrices they control (e.g. wider than row length of a corresponding matrix). As a result, the pixel driver chips may be staggered, for example, in zigzag patterned rows. It is not required that the pixel driver chips be mounted on the same surface as the LEDs, or between the LEDs. In accordance with all embodiments described herein the pixel driver chips 150 may also be located within the display panel, and may be positioned face up (e.g. with terminals facing up towards the LEDs 104), positioned face down (e.g. with terminals facing away from the LEDs), or both (with terminals on both top and bottom sides). Thus, where the pixel driver chips are described herein as being distributed about a display area, or interspersed with a display area, it is understood the pixel driver chips may be on a carrier layer (e.g. surface mounted) or embedded within the display panel. In accordance with all embodiments described herein the pixel driver chips may be adjacent to a corresponding plurality of pixels. Likewise, this includes configurations of both pixel driver chips on or within the display panel.

In particular, the arrangement of pixel driver chips 150 in accordance with embodiments can remove the requirement for driver ledges on the edges of a display panel 103. As a result, the display panel 103 may have reduced borders, or zero borders outside of the display area. The configuration may facilitate the formation of display panels with curved edges, as well as internal cutouts 109. In addition, the configuration may facilitate modular arrangements, including micro arrangements, of matrix tiles 155. Generally, the control circuit 810 may be coupled to an edge of the display panel 103. Bus columns of global routing lines 802 may extend from the control circuit 810 to supply global signals to the display panel 103. For example, the global routing lines 802 may include at least data clock lines, emission clock lines, and vertical selection token (VST) lines. The global routing lines are coupled to a plurality of "hybrid" pixel driver chips, and together form a backbone of the display. The corresponding backbone hybrid pixel driver chips receive the global signals and then transmit manipulated signals to their corresponding rows of row lines 804 connected to the other pixel driver chips 150 within the same row. For example, the global data clock and emission clock signals may be converted to manipulated signals and transmitted to the row of pixel driver chips 150 along manipulated data clock lines and manipulated emission clock lines. For example, the manipulated signals may include only the necessary information for the particular row.

The tile-based display panels in accordance with embodiments may have various arrangements of display tiles. For example, the display tiles may be arranged side-by-side (horizontally), stacked (vertically), both, as well as other configurations including fan-out in corner areas. Additionally, the bus columns of global routing lines 802 may be aligned and connected for stacked display tiles.

Figure 9:
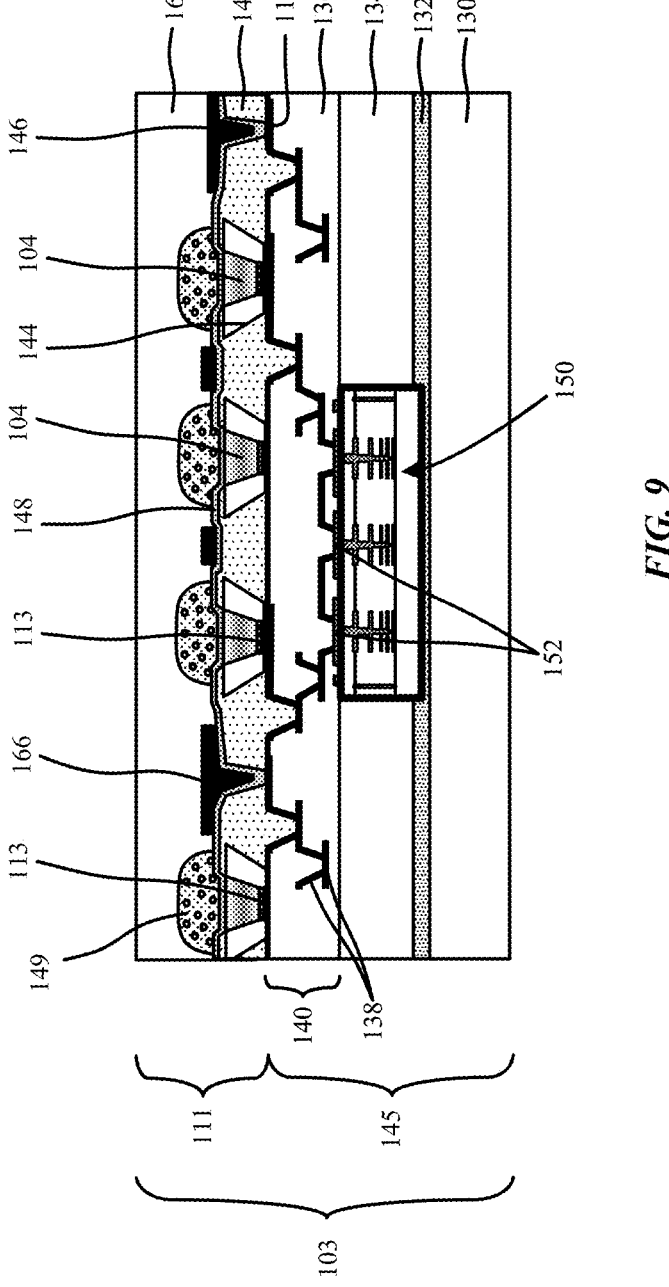
FIG. 9 is a close-up schematic cross-sectional side view illustration of a portion of display panel including an embedded pixel driver chip in accordance with an embodiment.

FIG. 9 is a close-up schematic cross-sectional side view illustration of a portion of display panel 103 including embedded pixel driver chips 150 in accordance with an embodiment. Method of manufacture may include transferring an array of pixel driver chips 150 to a carrier layer 130. For example, the carrier layer 130 may be a flexible substrate, such as glass, polyimide, etc. An adhesion layer 132 may optionally be formed on the carrier layer 130 to receive the pixel driver chips 150. Transfer may be accomplished using a pick and place tool. In an embodiment, a back side (non-functionalized) side is placed onto the adhesion layer 132, with the front side (active side, including contact pads 152) placed face up. The contact (terminal) pads 152 may be formed before or after transfer. As illustrated, a passivation layer 134 can be formed around the pixel driver chips 150, for example, to secure the pixel driver chips 150 to the carrier layer 130, and to provide step coverage for additional routing. Suitable materials for passivation layer 134 include polymers, spin on glass, oxides, etc. In an embodiment, passivation layer is a thermoset material such as acrylic, epoxy, benzocyclobutene (BCB), etc.

A redistribution layer (RDL) 140 may then be formed over the array of pixel driver chips 150. The RDL 140 may, for example, fan-out from the contact (terminal) pads 152 and additionally may include routing to/from control circuit 810. The RDL 140 may include one or more redistribution lines 138 and dielectric layers 136. For example, redistribution lines 138 may be metal lines (e.g. Cu, Al, etc.) and the dielectric layers 136 may be formed of suitable insulating materials including oxides (e.g. SiOx), nitrides, polymers, etc. In accordance with embodiments, RDL 140 includes one or more of the plurality global routing lines 802 and row lines 804 for signal and power (e.g. data signal, row synchronization signal, frame synchronization signal, and vertical synchronization token (VST), Vdd, etc.). RDL 140 additionally includes matrix tile 155 routing and driver pads 113 for LEDs 104. In accordance with some embodiments, strings of LEDs may be connected to a corresponding interconnect (e.g. string, or line).

Together the carrier layer 130, pixel driver chips 150 embedded in the passivation layer 134, and RDL 140 form a backplane 145 including LED driver circuitry. At this stage in the manufacturing process, the backplane 145 may be tested to determine operability of the pixel driver chips 150. For example, this may be done by probing the driver pads 113 or other test circuitry formed within the RDL 140. For example, the RDL 140 can include a test circuit with test pads at an edge of the display panel 103 which can be probed to test functionality of the pixel driver chips 150. This testing can be performed before or after transfer of the LEDs 104. In an embodiment, the test circuit can be removed from the edge of the display panel 103 after testing, for example during formation of the trenches 116, or after lamination/molding.

In the LED manufacturing process illustrated in FIG. 9, additional dielectric layers and routing layers may optionally be formed followed by the transfer and bonding of LEDs 104 onto the stack-up, for example using solder. In an embodiment, the LEDs 104 are optionally bonded inside bank structure openings 144 in a bank layer 142. The bank structure openings 144 may optionally be reflective, and may optionally be filled after bonding of the micro LEDs 104. The bank layer 142 may be further patterned to create openings 146 to expose a routing layer, such as (e.g. negative) voltage power supply lines 115, or cathodes. A top transparent or semi-transparent electrically conductive layer(s) 148 can then be deposited to provide electrical connection from the top sides of the LEDs 104 to the voltage power supply lines, or cathodes. Suitable materials include transparent conductive oxides (TCOs), conductive polymers, thin transparent metal layers, etc.

In an embodiment, a black matrix layer 166 is optionally formed over the bank layer 142. Alternatively, the bank layer 142 may be formed of a black matrix material. Such a black matrix material may reduce internal reflection (e.g. specular reflection) inclusive of reflection from the electrical routing and pixel driver chips 150. Increased area of the black matrix layer may correspond to a decrease in reflectivity. The black matrix layer may be formed of suitable materials, such as polymer and glass and may include organic dye-based absorbers (including mixed molecule dyes) as well as pigment-based absorbers, or particles to absorb a specific visible wavelength spectrum. In an embodiment, the black matrix layer includes carbon-black particles.

In some embodiments, one or more color filter layers 149 can be formed over the LEDs 104. The color filter layers 149 for example, can include nano-particles, ink, quantum dots, etc. embedded within a matrix material to selectively tune the emission spectrum from the LEDs 104. An overcoat layer 165 can also be formed over the underlying structure. Overcoat layer 165 may be an optically clear material, such as an acrylate, silicone, etc., and may have a variety of functions, such as mechanical protection, levelling for bonding with subsequent layers, and chemical passivation (e.g. from environment). The illustrated stack-up from the LEDs 104 to overcoat layer 165 may form the emission layer stack 111 on top of the backplane 145.

LED 104 and pixel driver chip 150 sizes in accordance with embodiments are scalable from macro to micro sized. In an embodiment, the pixel driver chips 150 may have a length with a maximum dimension of less than 400 μm, or even less than 200 μm. When surface mounted, the pixel driver chips 150 can have a further reduced x-y dimension of pixel pitch scale. Micro LEDs in accordance with embodiments may have a maximum dimension of less than 100 μm, or even less than 20 μm, such as less than 10 μm, or even less than 5 μm for displays with high resolution and pixel density.

In accordance with embodiments the kirigami patterns 112 of trenches 116 can be formed at a variety of manufacturing stages. For example, the backplanes 145 can be patterned or cut prior to forming the emission layer stack 111. The trenches 116 may also be patterned or cut during formation of the backplanes 145. Alternatively, the trenches 116 can be formed through patterning (e.g. lithography and etching) or cutting (e.g. laser) after addition of the emission layer stack 111. The particular cutting technique may be selected based on street width and height of the LED and pixel arrangements. In an embodiment cutting is performed with a femtosecond laser to achieve a narrow spot (cut) size or width. The cut and molded display structures and techniques may be particularly applicable for micro LED displays due to small LED size, and also stability of the inorganic semiconductor-based micro LEDs, which are less susceptible to degradation due to exposure to environment than organic LEDs (OLEDs).

Figure 10:
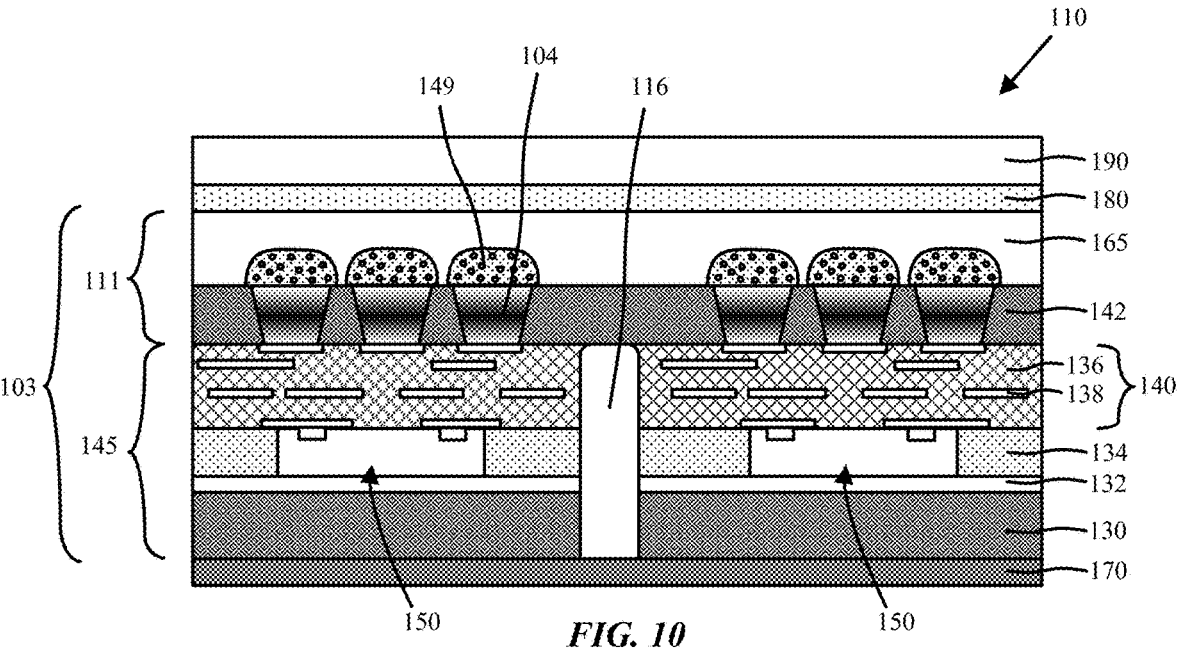
FIG. 10 is a close-up schematic cross-sectional side view illustration of a portion of display structure display panel including a trench between embedded pixel driver chips in accordance with an embodiment.

Referring now to FIGS. 10-13 various close-up schematic cross-sectional side view illustrations are provided for a portion of a display structure 110 with various trench 116 designs formed in a display panel 103 of the display structure. As previously described with regard to FIG. 1, display panel 103 can include a display area 105 spanning across a main body area 102 and an edge area 108 around the main body area of the display panel 103. Referring now to FIG. 10, the display panel can include a backplane 145 including LED driver circuitry. For example, the LED driver circuitry can the conventional thin film transistor (TFT) driving circuitry or a combination of pixel driver chips 150 and redistribution layer (RDL) 140. An emission layer stack 111 may span over the backplane 145. In an embodiment, the emission layer stack 111 includes a matrix of LEDs 104 dispersed across the display area 105 and electrically connected with the LED driver circuitry. A pattern of trenches 116 can extend at least partially through the backplane 145 in the edge area of the display panel 103. In accordance with embodiments, the trenches 116 do not extend past the matrix of LEDs 104 in the upper emission layer stack 111. In accordance with embodiments, the trenches 116 can be buried beneath the micro LEDs or optically important layers of the upper emission layer stack 111 so that the trenches are not observable from above.

Still referring to FIG. 10, the display panel 103 stack-up is similar that previously described with regard to FIG. 9. One difference is the bank layer 142 is shown as a black matrix layer within with the micro LEDs 104 embedded. Thus, it is not necessary to mount the micro LEDs within bank structure openings 144. Instead, the bank layer 142 can be applied after transfer of the micro LEDs 104. Also shown, a backfilm 170 can be formed on the back side of the patterned backplane 145. The backfilm 170 can provide mechanical support to the display panel 103 and/or provide a sealing function. The backfilm 170 may be flexible or rigid. In an embodiment, the backfilm 170 is formed of a black matrix material. Additionally, a coverfilm 190 can be formed over the display panel 103. For example, the coverfilm 190 can be an optically transparent polymer or glass material. In an embodiment, the coverfilm 190 is laminated with an optically clear adhesive layer 180. The coverfilm 190 can provide mechanical support to the display panel 103 and/or provide a sealing function. The coverfilm 190 may be flexible or rigid.

The trenches 116 in accordance with embodiments can be formed at a variety of manufacturing stages. In one embodiment, the trenches 116 are formed partially, or completely through the backplane 145 prior to forming the upper emission layer stack 111. Alternatively the trenches 116 can be formed after formation of the upper emission layer stack 111, and may optionally be completely beneath the upper emission layer stack 111, or can potentially extend slightly into the upper emission layer stack 111, without extending past the micro LEDs 104. Location and selection of depth of the trenches 116 can be determined so as to not directly impact (pixel) density of the display panel. For example, depth of trenches 116 may be different if located between matrix tiles 155 compared to spanning across a portion of a matrix tile 155 and underneath one or more micro LEDs 104.

Formation of the upper emission layer stack 111 may be an additive process including transfer and bonding the micro LEDs 104, formation of the bank layer 142 using a suitable process such as slot coating, spray deposition, etc. The electrically conductive layer 148 may then be formed using a suitable technique such as ink jet printing, etc. Optional color filter layers 149 can be selectively formed over the LEDs 104, followed by formation of the overcoat layer 165, and application of the coverfilm 190. The backfilm 170 can be applied before formation of the upper emission layer stack 111 or after.

Figure 11:
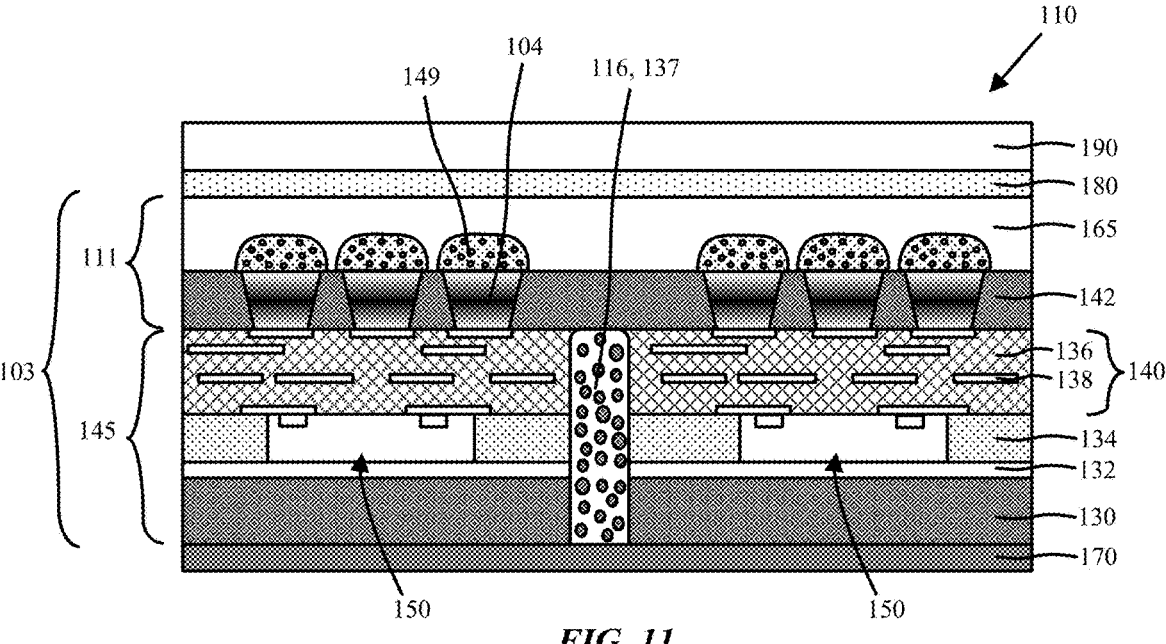
FIG. 11 is a close-up schematic cross-sectional side view illustration of a portion of display structure display panel including a trench filled with a stretchable material in accordance with an embodiment.

The trenches 116 in accordance with embodiments can be open voids, or optionally filled with a stretchable material. FIG. 11 illustrates an exemplary embodiment in which a trench 116 is at least partially, and potentially fully, filled with stretchable material 137. For example, the stretchable material 137 can be characterized by a stiffness that is less than the backplane 145 (e.g. stiffness of the combined structure of the backplane layers). More generically, the stretchable material 137 may be a flexible material, such as polymer (e.g. silicone) with comparatively high stretchability.

Figure 12:
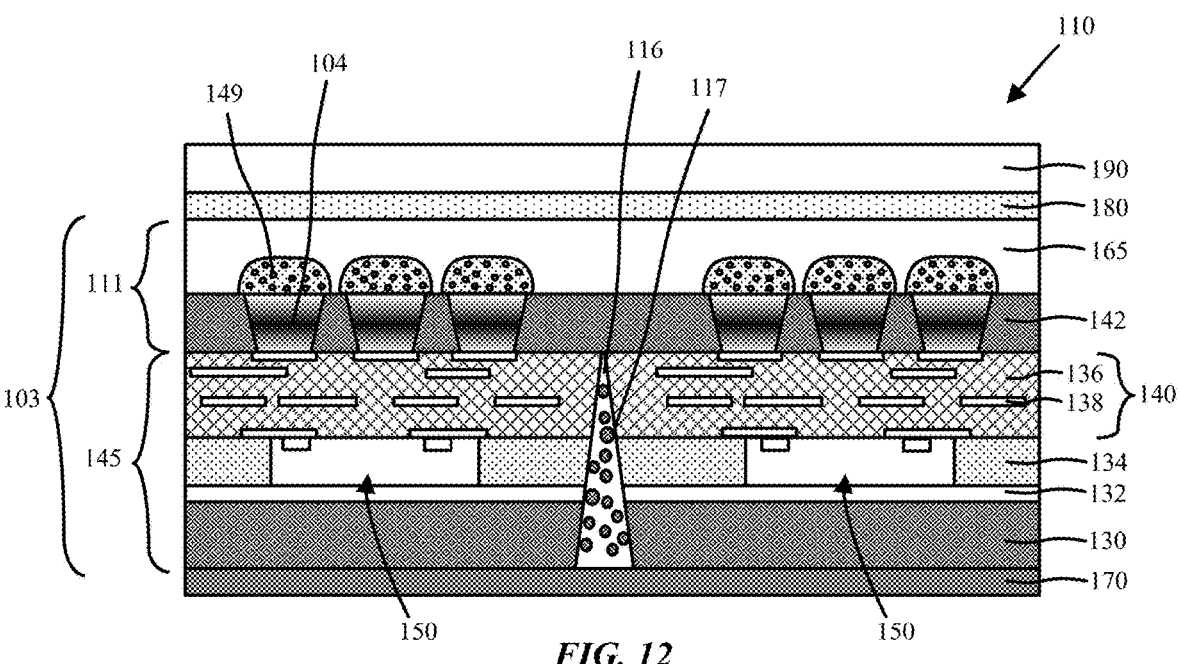
FIG. 12 is a close-up schematic cross-sectional side view illustration of a portion of display structure display panel including a trench with tapered sidewalls in accordance with an embodiment.

The trenches 116 may also have a variety of shapes to alleviate strain or facilitate bending. FIG. 12 illustrates an exemplary embodiment in which a trench 116 having tapered sidewalls 117, where the trench 116 opening a back side of the backplane 145 is larger than a terminal end of the trench depth adjacent the upper emission layer stack 111.

Figure 13:
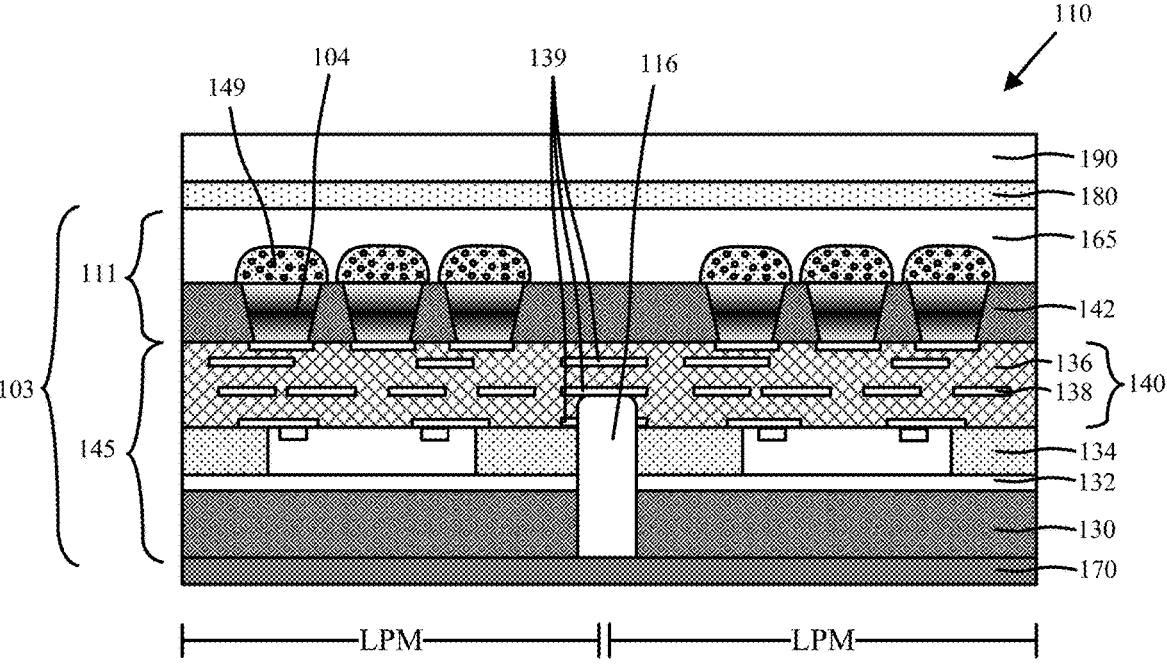
FIG. 13 is a close-up schematic cross-sectional side view illustration of a portion of display structure display panel including a shallow trench depth partially extending through the backplane in accordance with an embodiment.

The backplane 145 can also be designed to include dummy features to control process of trench 116 depth. FIG. 13 illustrates an exemplary embodiment in which the RDL 140 includes a stack of one or more (plurality) of dummy traces 139 aligned with the pattern of trenches 116. In this case, patterning or drilling to form trenches 116 can be at least partially controlled by dummy traces 139, which can function as etch stop layers, or visual indicators for depth.

In accordance with embodiments, a variety of designs can be utilized to achieve specified bending and strain management. Such design variations include bank layer 142 material selection, trench 116 etch stopping and control, etc. Trench 116 patterns (e.g. kirigami) can also be arranged for selected stretchability. Stretchable materials 137 can be selected for specified stretchability.

Figures 14A, 14B:
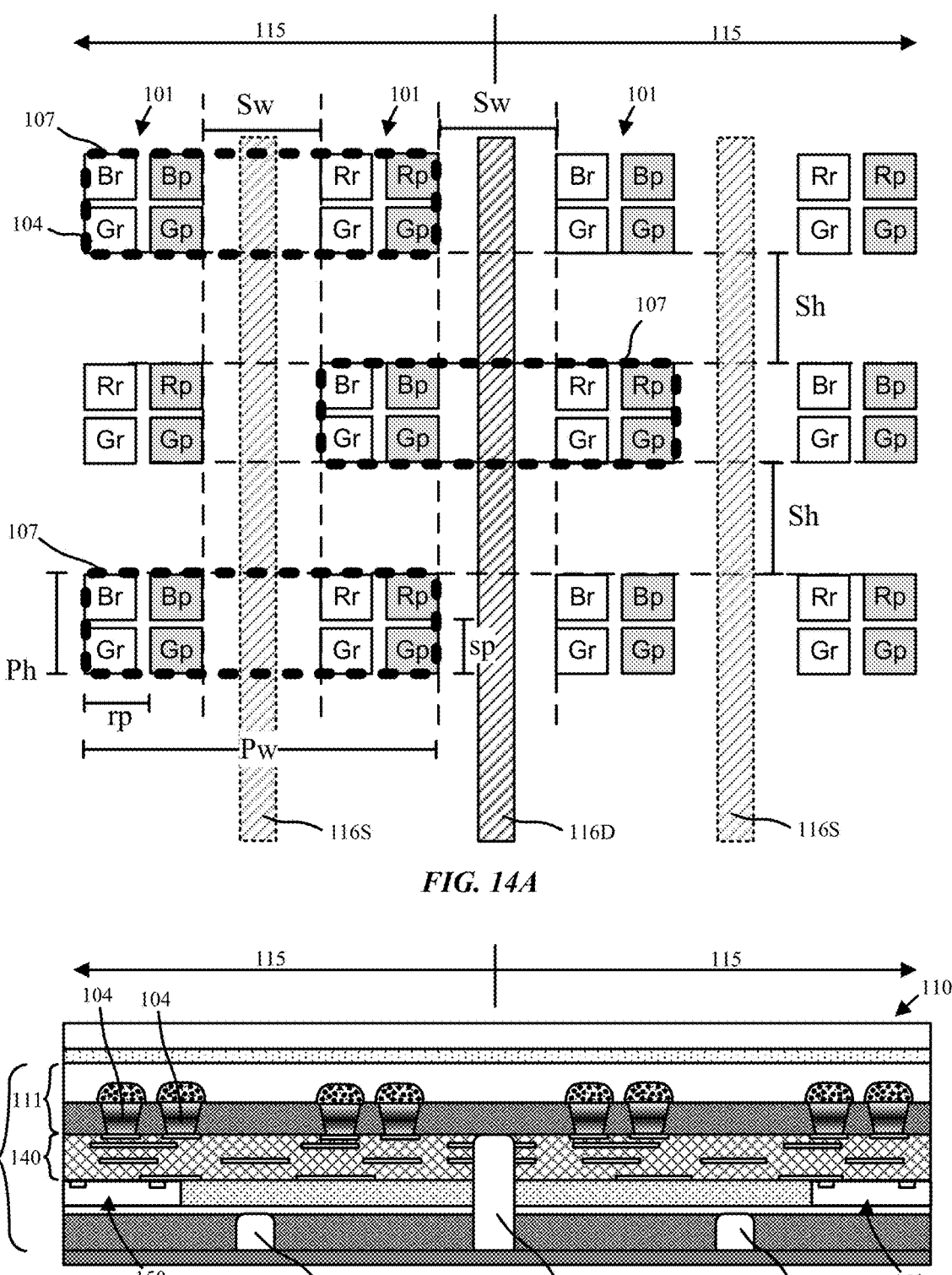
FIG. 14A is a schematic top view illustration of a pixel array with clustered subpixels, inter-matrix trenches, and intra-matrix trenches in accordance with an embodiment.
FIG. 14B is a schematic cross-sectional side view illustration of the pixel array of FIG. 14A with clustered subpixels, inter-matrix trenches, and intra-matrix trenches in accordance with an embodiment.

The trenches 116 can also be formed to different depths, as well as different locations relative to the matrix tiles 155. FIG. 14A is a schematic top view illustration of a pixel array with subpixel clusters 101, inter-matrix trenches, and intra-matrix trenches in accordance with an embodiment. FIG. 14B is a schematic cross-sectional side view illustration of the pixel array of FIG. 14A with subpixel clusters 101, inter-matrix trenches, and intra-matrix trenches in accordance with an embodiment. Specifically, the inter-matrix trenches (between matrix tiles 155) are illustrated as deep trenches 116D, while the intra-matrix trenches (within a matrix tile 155) are illustrated as shallow trenches 116S. Specifically, the deep trenches 116D may be formed to a depth that is greater/deeper than the shallow trenches 116S. In an embodiment, the deep trenches 116D are arranged between matrix tiles 155, each matrix tile including a micro-matrix of LEDs 104 coupled to a pixel driver chip 150, and the shallow trenches 116S are arranged within the matrix tiles 155. As shown in FIG. 14B, the shallower trenches 116S may be limited by electrical routing (redistribution lines 138) from the pixel driver chips 150 to the overlying micro LEDs 104, while such electrical routing (redistribution lines 138) can more easily be eliminated between matrix tiles 155, or even replaced with dummy traces 139. In an embodiment, redistribution lines 138 can span directly over at least some, if not all, of the shallower trenches 116S. In accordance with embodiments, depth of the shallower trenches 116S can be limited to the carrier layer 130, passivation layer 134, or within the RDL 140. In accordance with embodiments, depth of the deep trenches 116D can be within the RDL 140, such as to an upper metal layer (e.g. including redistribution lines 138), completely through the RDL 140, or partially into a lower portion of the emission layer stack 111 (but not past the micro LEDs 104).

In an embodiment, the pattern of trenches 116 within the display panel 103 includes a first group of trenches 116 with a first depth (e.g. shallow trenches 116S), and a second group of trenches 116 with a second depth greater than the first depth (e.g. deep trenches 116D). For example, the second group of trenches 116 may be arranged between matrix tiles 155, each matrix tile 155 including a micro-matrix of LEDs 104 coupled to a pixel driver chip 150, and the second group of trenches 116 is arranged within the matrix tiles 155.

The particular pixel arrangement illustrated in FIG. 14A is that of a diamond arrangement, with red (R), green (G), and blue (B) micro LEDs 104 arranged in pixels 107, along with primary (e.g. Rp, Gp, Bp) and redundant (e.g. Rr, Gr, Br) micro LEDs 104. The micro LED 104 redundancy, as well as diamond arrangement are exemplary, and embodiments do not require such arrangements.

Rather than pixel clustering, the clustering into subpixel clusters 101 in accordance with embodiments can increase street width (Sw) and street height (Sh) between columns and rows of pixels 107 to accommodate larger trench 116 widths. In the particular embodiment illustrated, subpixel pitch (sp) between different colored subpixels is approximately the same as redundant LED pitch (rp) within a same subpixel. As shown, the clustered subpixels result in a larger pixel width (Pw) than the street widths (Sw) or street heights (Sh). The pixel width (Pw) illustrated includes a street width (Sw) running through pixel. 107. Street widths (Sw) also run between adjacent pixels 107. The street width (Sw) may be the same for pixels on opposite sides of a street, as for the same street running between subpixel clusters 101 within a pixel 107. In an embodiment, the street width (Sw) between matrix tiles 155 is the same as street width (Sw) within matrix tiles 155. The pixel height (Ph) may be limited to a subpixel cluster 101 height, and does not include a street height (Sh). Thus, pixel height (Ph) may be less than the pixel width (Pw). In the particular embodiment illustrated a green emitting LED pair is provided with each subpixel cluster 101, either with a red emitting LED pair or blue emitting LED pair, though other arrangements are possible.

In accordance with embodiments, the edge area 108 can include a rounded edge area (e.g. corner 119) and one or more straight edge areas (e.g. between corners 119). While the entire display panel 103 edges can be rounded, it may be feasible for routing purposes to include straight edge areas except for the rounded edge areas (e.g. corners 119) to facilitate column/row routing configurations.

Figure 15:
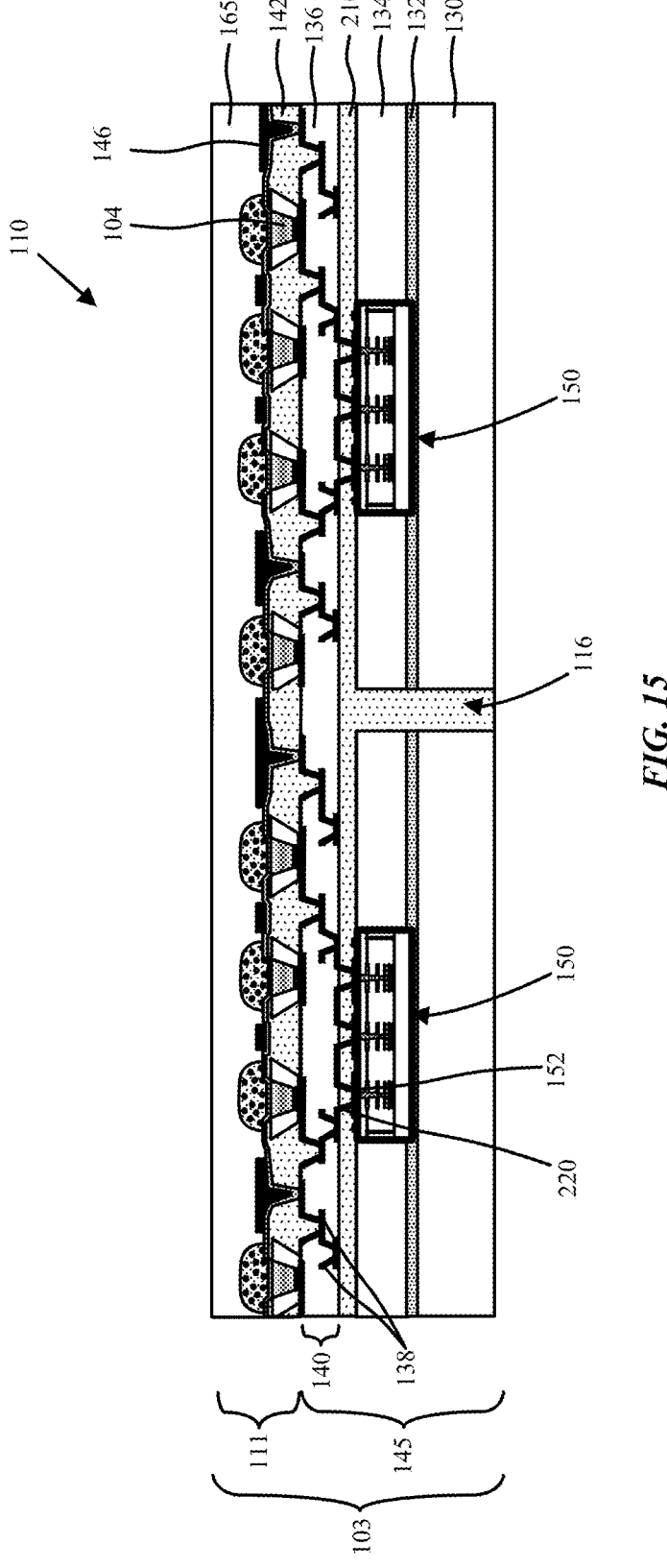
FIG. 15 is a close-up schematic cross-sectional side view illustration of a portion of display panel including a trench and decoupling layer in accordance with an embodiment.
Figure 16:
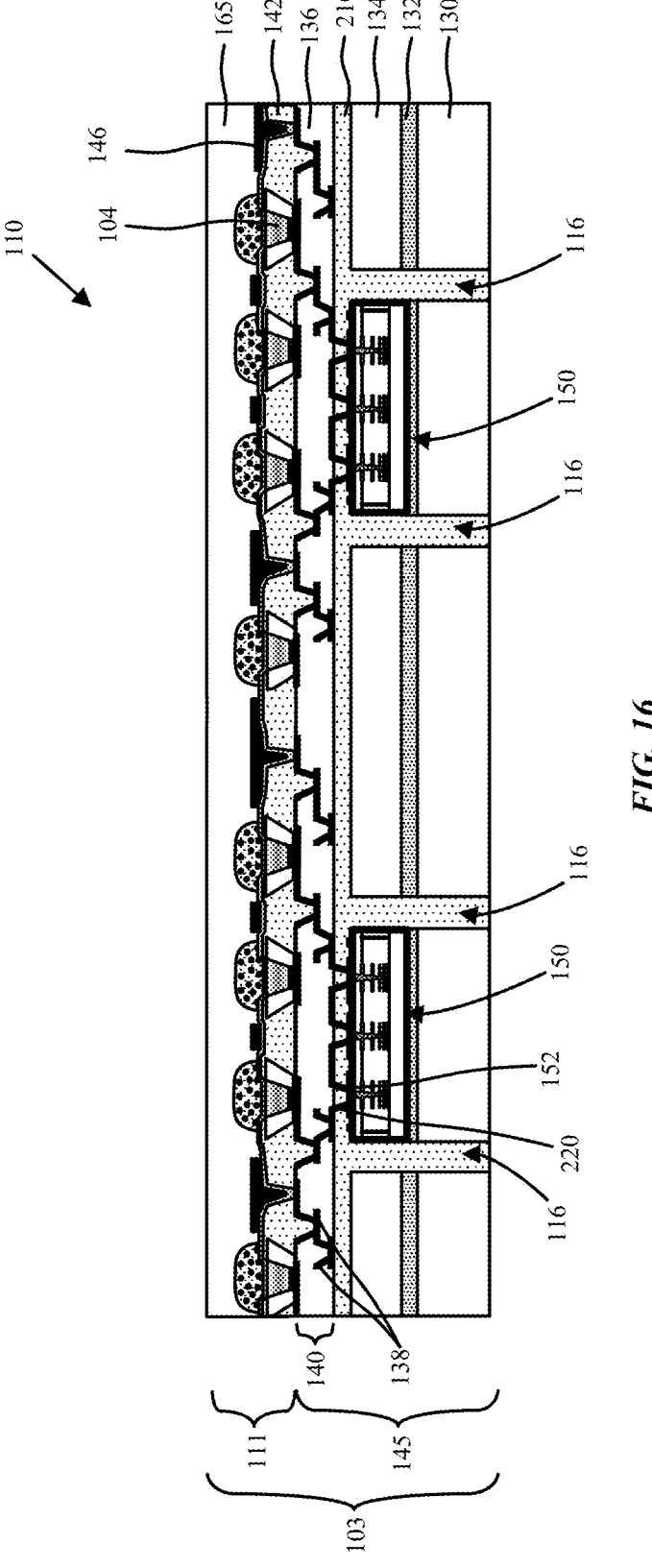
FIG. 16 is a close-up schematic cross-sectional side view illustration of a portion of display panel including trenches and decoupling material adjacent pixel driver chip edges in accordance with an embodiment.

Referring now to FIGS. 15-16 additional close-up schematic cross-sectional side view illustrations are provide for a portion of display panel including a trench and decoupling layer 210 in accordance with embodiments. It is to be appreciated that while illustrated separately the decoupling layer 210 can be integrated with any of the trench designs described herein, inclusive of FIGS. 10-14B. As shown in FIGS. 15-16 in accordance with embodiments, the decoupling layer 210 can be formed over the array of pixel driver chips 150. The decoupling layer 210 may have a tuned effective modulus and thickness to provide decouple stress near the pixel driver chips 150 that can result from trench formation and stretching or bending the display panel into a 3D compound film curvature. For example, the decoupling layer 210 may be formed of a material similar to stretchable material 137, which can be a flexible material such as polymer (e.g. silicone) with comparatively high stretchability. In an embodiment, the decoupling layer 210 is formed of a material characterized by an elastic modulus of 1-0.1 MPa. In an embodiment, the decoupling layer 210 is 5-10 microns thick above the pixel driver chips 150. The decoupling layer 210 may be characterized by a stiffness that is less than the combined stiffness of the other backplane 145 layers.

In the particular embodiment illustrated in FIG. 15 the decoupling layer 210 can span over the array of pixel driver chips 150, and optionally within trenches 116 between the pixel driver chips 150. RDL 140 may additionally span over the decoupling layer 210. Electrical interconnects 220 can additionally be formed through the decoupling layer 210 to provide electrical connection between the contact pads 152 of the pixel driver chips 150 and the electrical routing (redistribution lines 138) of the overlying RDL 140. As will become more apparent in the following description, various manners are possible for forming the electrical interconnects 220 and sequence for integrating the decoupling layer 210. For example, in the embodiment illustrated in FIG. 15, the electrical interconnects 220 can be formed using thin film processes similar to formation of the redistribution lines 138.

The embodiment illustrated in FIG. 16 is similar to that illustrated in FIG. 15, with location of trenches 116 and decoupling material instead being adjacent to the pixel driver chip 150 edges. For example, the decupling material can be a separately formed (e.g. as stretchable material 137), or formed as part of the decoupling layer 210. In this manner, pixel driver chips 150 can be further mechanically isolated.

Figures 17A, 17B, 17C, 17D:
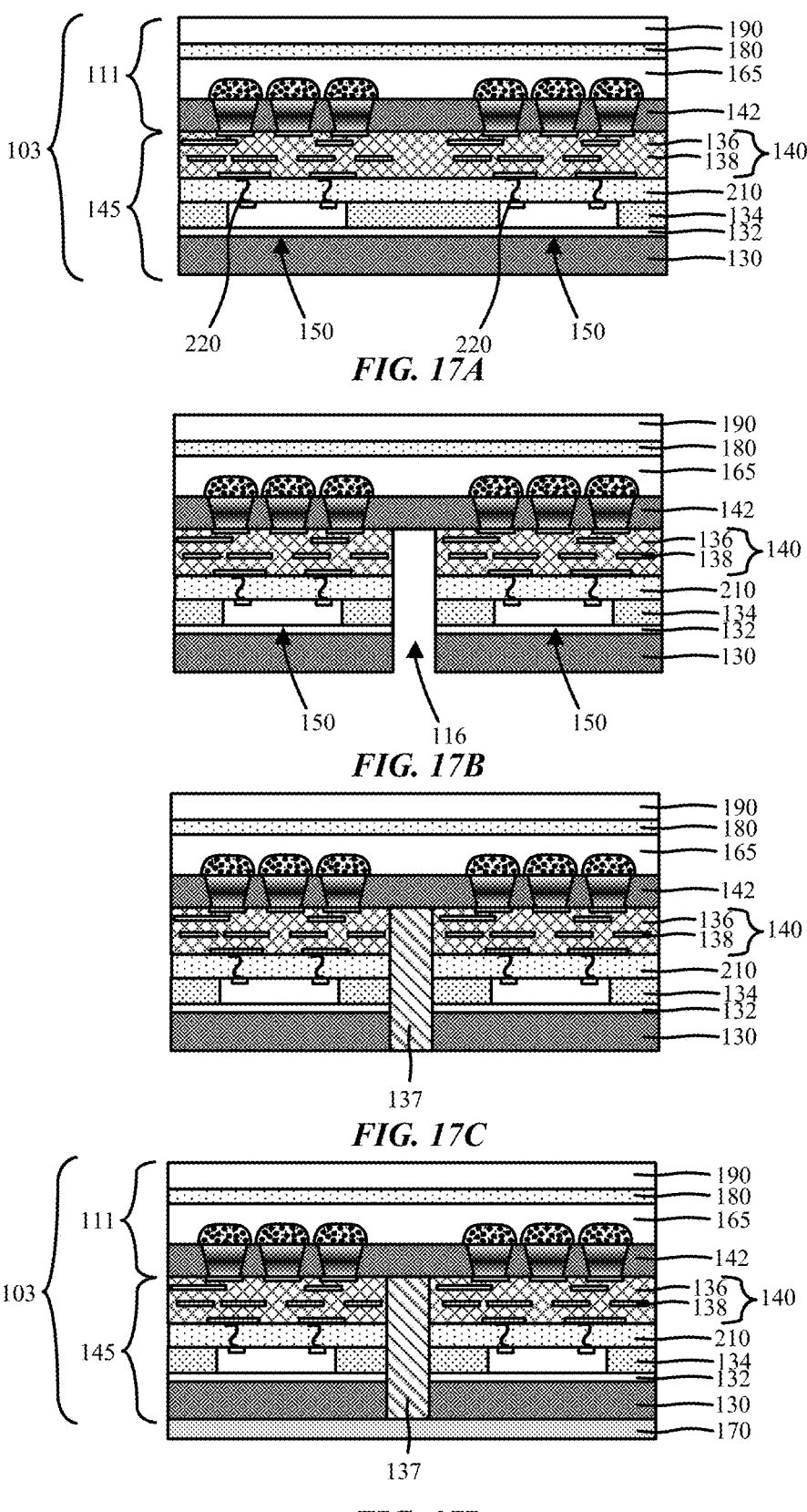
FIGS. 17A-17D are schematic cross-sectional side view illustrations for a process flow including trench formation with backside cutting into the redistribution layer in accordance with embodiments.

FIGS. 17A-17D are schematic cross-sectional side view illustrations for a process flow including trench 116 formation with backside cutting into the RDL 140 in accordance with embodiments. As shown, the process flows can begin with an incoming display panel 103 in FIG. 17A including an emission layer stack 111 on top of the backplane 145, where decoupling layer 210 can be formed as part of the backplane 145. A pattern of trenches 116 can then be formed through the backplane 145, including the decoupling layer 210 and optionally into (or through) the RDL 140 as shown in FIG. 17B using a suitable technique such as laser cutting. This may be followed by application of stretchable material 137 into the trenches 116 as shown in FIG. 17C, followed by formation of a backfilm 170 as shown in FIG. 17D. For example, the backfilm may be a black matrix material, and may be applied using a suitable technique including lamination. The process flow of FIGS. 17A-17D may also be used to integrate compliant/flexible electrical interconnects 220.

Figure 18A:
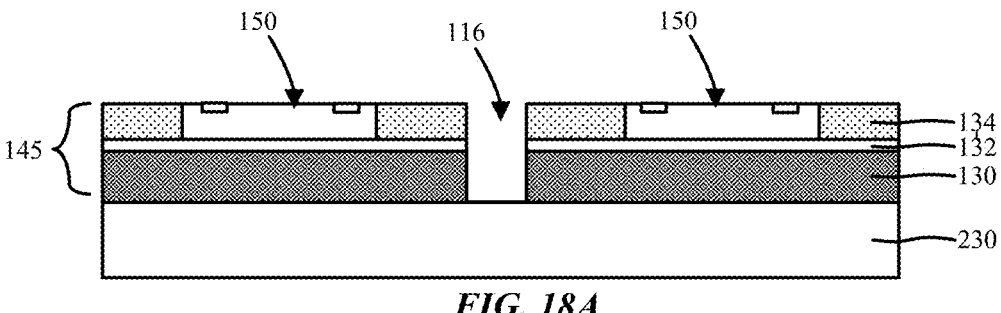
FIGS. 18A-18D are schematic cross-sectional side view illustrations for a process flow including lithographic trench formation in accordance with embodiments.
Figure 18B:
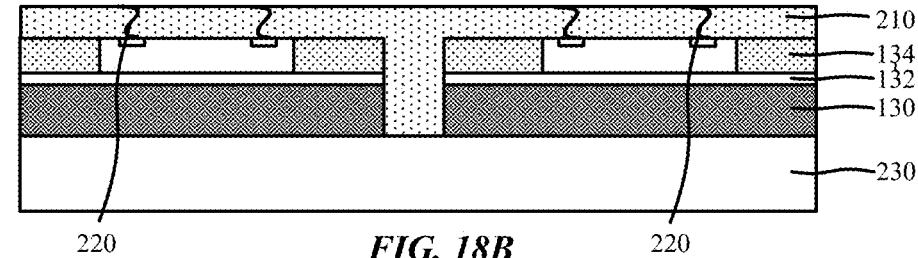
Figure 18C:
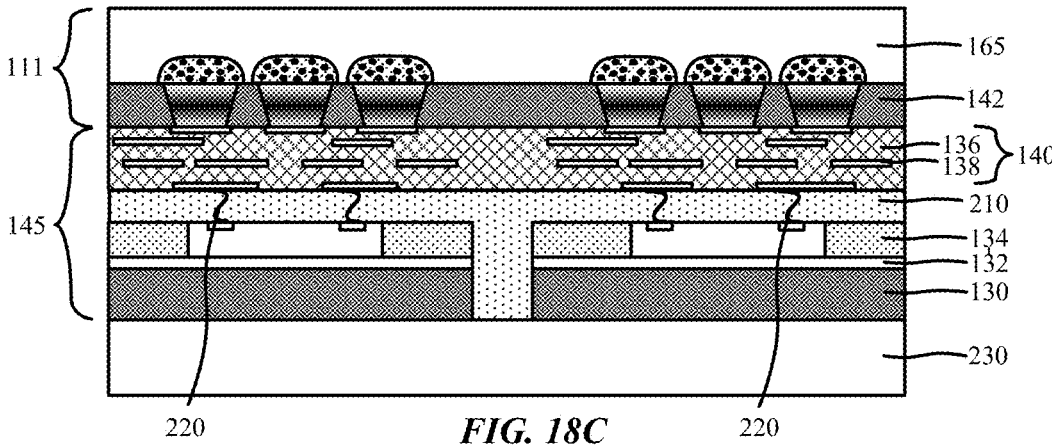
Figure 18D:
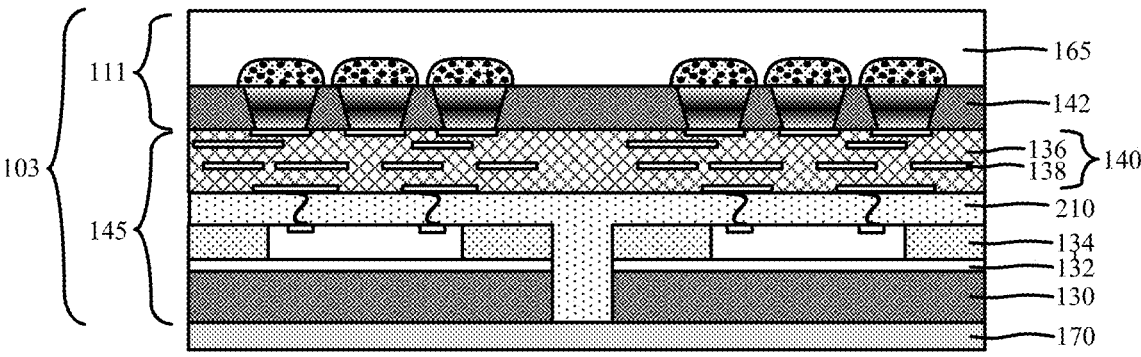

FIGS. 18A-18D are schematic cross-sectional side view illustrations for a process flow including lithographic trench 116 formation in accordance with embodiments. As shown the trench formation sequence may be a top side processing sequence rather than backside sequence. As shown in FIG. 18A, the panel process may begin with formation of the backplane 145 on a carrier substrate 230, such as glass or rigid material. A pattern of trenches 116 can then be formed through the bottom layers of the backplane 145 including the passivation layer 134, adhesion layer 132, and carrier layer 130. This may be followed by the formation of decoupling layer 120 over the pixel driver chips 150 and passivation layer 134. Electrical interconnects 220 can optionally be formed with the decoupling layer 120, included with the decoupling layer 120, or formed after the decoupling layer 120. The RDL 140, can then be formed over the decupling layer and electrical interconnects 220 as shown in FIG. 18C, followed by formation of the emission layer stack 111. This may then be followed by removal of the carrier substrate 230 and formation of backfilm 170 as shown in FIG. 18D. The process flow of FIGS. 18A-18D may also be used to integrate compliant/flexible electrical interconnects 220.

Figure 19A:
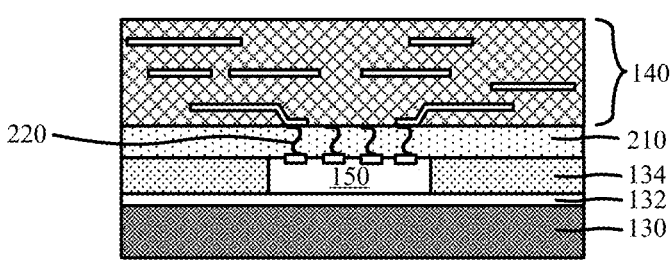
FIG. 19A is a schematic cross-sectional side view illustration of a flexible link connection between a pixel driver chip and redistribution layer in accordance with an embodiment.

The decoupling layer 210 and conductive interconnects 220 can each be integrated into the backplane 145 by a variety of methods in accordance with embodiments. FIG. 19A is a schematic cross-sectional side view illustration of a flexible link connection between a pixel driver chip 150 and RDL 140 in accordance with an embodiment. More specifically the conductive interconnects 220 can be flexible links formed in various manners such as wire bonds, or bonded spring connections etc. In some embodiments, the wire bonds or spring connections can be first bonded to the pixel driver chip 150 or RDL 140, followed by formation of the decoupling layer 210. Alternatively, the wire bonds or spring connections can be formed as part of the decoupling layer 210, prior to integration of the decoupling layer.

Figure 19B:
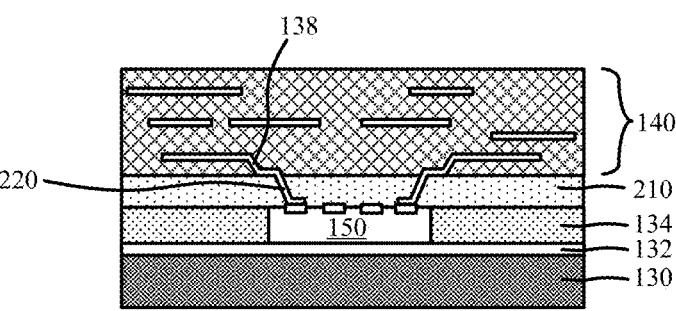
FIG. 19B is a schematic cross-sectional side view illustration for a plurality of patterned via connections in decoupling layer between a pixel driver chip and redistribution layer in accordance with an embodiment.

FIG. 19B is a schematic cross-sectional side view illustration for a plurality of patterned via connections in decoupling layer between a pixel driver chip 150 and RDL 140 in accordance with an embodiment. More specifically the conductive interconnects 220 can be patterned via connections, formed using thin film processes similar to formation of the redistribution lines 138 (and via connections within RDL 140). In such an embodiment, the decoupling layer 210 may be a low modulus slit coat-able, or jet-able material which is additionally photopattern-able.

Figure 19C:
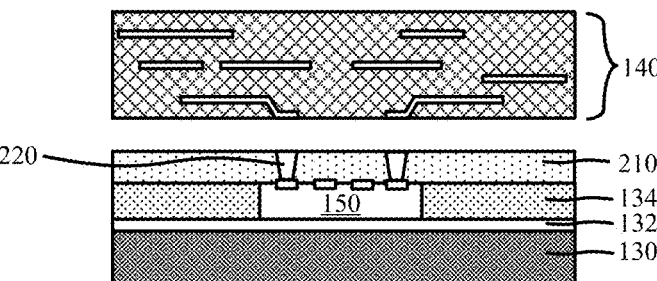
FIG. 19C is a schematic cross-sectional side view illustration for a plurality of via connections formed within via openings patterned into a decoupling layer between a pixel driver chip and redistribution layer in accordance with an embodiment.

FIG. 19C is a schematic cross-sectional side view illustration for a plurality of via connections formed within via openings patterned into a decoupling layer between a pixel driver chip 150 and RDL 140 in accordance with an embodiment. More specifically, the decoupling layer 120 can be photopatterned to form via openings, followed by formation of the conductive interconnects 220 into the via openings using a suitable technique, such as metal paste dispensing followed by thermal process. In such an embodiment, the via-shaped conductive interconnects may include coalesced metal particles. In such an embodiment, the decoupling layer 210 may be a low modulus slit coat-able, or jet-able material which is additionally photopattern-able. In the illustrated embodiment the decoupling layer 120 is formed on the backplane 145 prior to formation of the RDL 140.

Figure 19D:
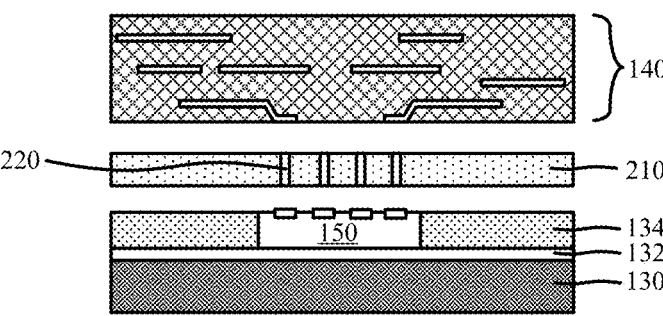
FIG. 19D is a schematic cross-sectional side view illustration for a separate decoupling layer with built-in vias between a pixel driver chip and redistribution layer in accordance with an embodiment.

FIG. 19D is a schematic cross-sectional side view illustration for a separate decoupling layer 210 with built-in vias between a pixel driver chip 150 and RDL 140 in accordance with an embodiment. In such an embodiment, the decoupling layer 210 is a separate interposer layer, where the conductive interconnects 220 are built-in, for example, as vias. Alternatively, the decoupling layer 210 can be an anisotropic conductive film (ACF) where conductive interconnects are created by conductive fillers distributed throughout the decoupling layer 210. The decoupling layer 210 can be formed with a low modulus material, which is bonded to both the lower layers within backplane 140 and RDL 140.

Figure 20A:
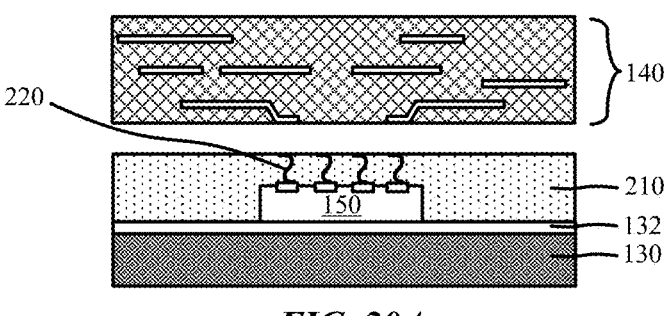
FIG. 20A is a schematic cross-sectional side view illustration for a process sequence in which the decoupling layer is fabricated as part of a lower part of the display panel in accordance with an embodiment.
Figure 20B:
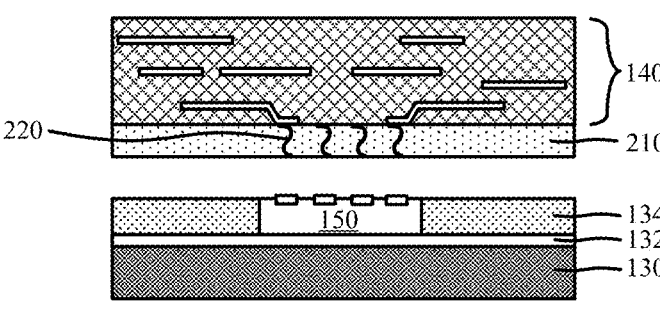
FIG. 20B is a schematic cross-sectional side view illustration for a process sequence in which the decoupling layer is fabricated as part of an upper part of the display panel in accordance with an embodiment.
Figure 20C:
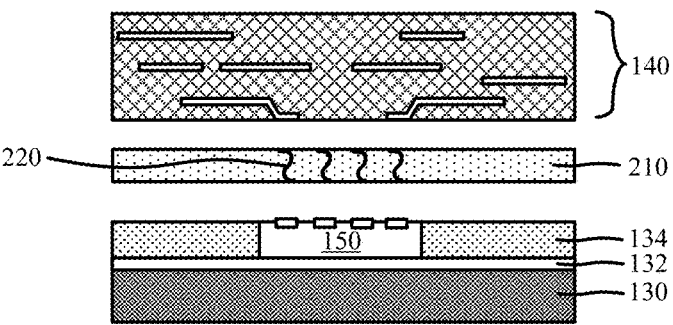
FIG. 20C is a schematic cross-sectional side view illustration for a process sequence in which the decoupling layer is incorporated into the display panel as a compliant interposer in accordance with an embodiment.

Referring now to FIGS. 20A-20C various process sequences are illustrated for integrating a decoupling layer 210 with flexible link conductive interconnect 220, similar to FIG. 19A described above. Referring again briefly to FIG. 19A, the decoupling layer 210 can optionally be fabricated during the backplane 145 process, and prior to RDL 140. As shown, the decoupling layer 210 can be formed over the pixel driver chips 150 and passivation layer 134. In the embodiment illustrated in FIG. 20A the decoupling layer 210 can be fabricated as part of a lower layer of the backplane. For example, the decoupling layer 210 can be formed over and around the pixel driver chips 150, displacing the previously described pixel driver chips 150. This can be followed by bonding of the upper part of the backplane including the RDL 140, which can be fabricated separately.

Alternatively, in the embodiment illustrated in FIG. 20B the decoupling layer 210 can be fabricated as an upper part of the backplane including the RDL 140, and can then be bonded to the lower layers of the backplane 145. In yet another embodiment illustrated in FIG. 20C, the decoupling layer 210 can be fabricated as a compliant interposer, which can be sandwiched between the upper part of the backplane including the RDL 140 and the lower layers of the backplane 145.

Figure 21A:
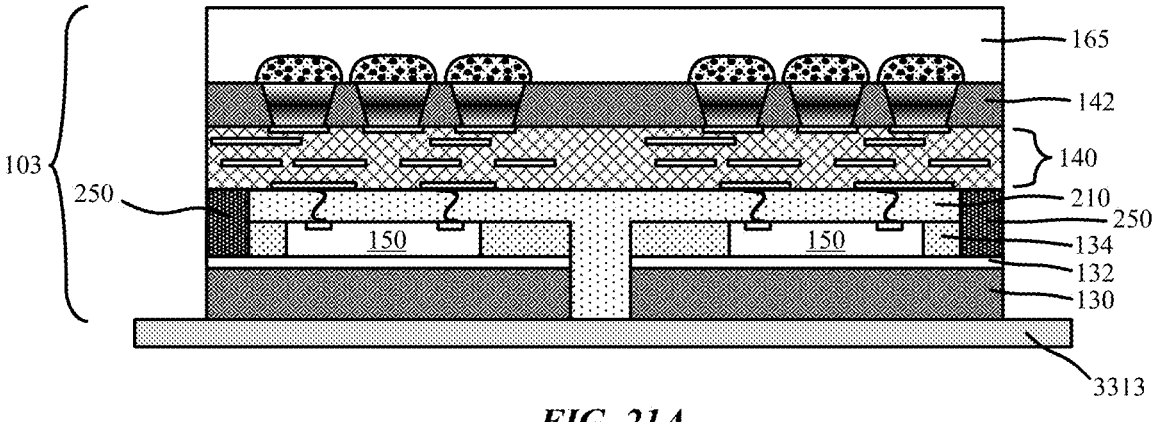
FIG. 21A is a schematic cross-sectional side view illustration of a display panel including a decoupling layer and stiffener ring in accordance with an embodiment.
Figure 21B:
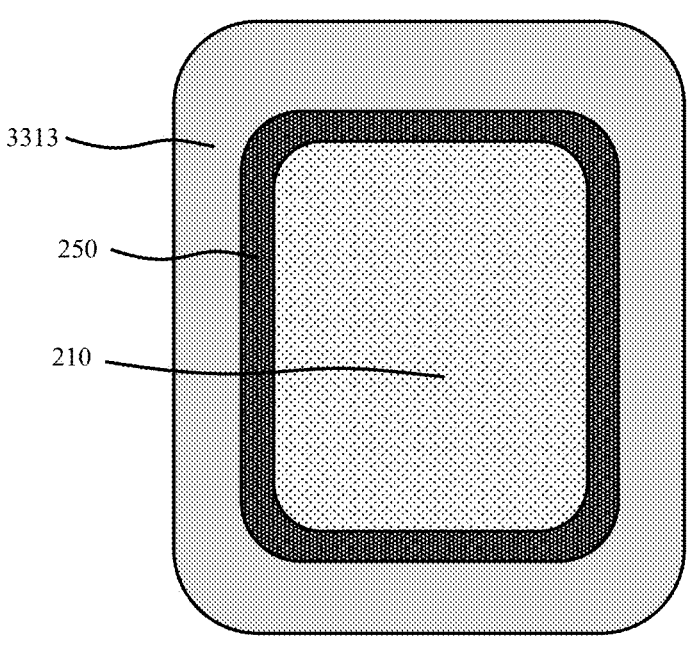
FIG. 21B is a schematic top view illustration of a display panel including a decoupling layer and stiffener ring in accordance with an embodiment.

In accordance with embodiments, various stiffener structures may be included within the display panel, in combination with the decoupling layer. FIG. 21A is a schematic cross-sectional side view illustration of a display panel including a decoupling layer 210 and stiffener ring 250 in accordance with an embodiment. FIG. 21B is a schematic top view illustration of a display panel including a decoupling layer 210 and stiffener ring 250 in accordance with an embodiment. In the particular embodiment illustrated, the display panel 103 is optionally formed on an oversized carrier film 3313 (see FIG. 33), which can be used to help bending into a 3D contour shape. In the illustrated embodiment, a stiffener ring 250 can surround the decoupling layer 210 along a periphery of the display panel. In this manner the decoupling layer 210 can be confined to the display area 105 of the display panel so that the mechanical decoupling only occurs in the display area. The stiffener ring 250 can provide a strong coupling effect between the top layers of the backplane 145 including RDL 140 and the lower layers of the backplane including the carrier layer 130 so that when the oversized carrier film 3313 is stretched in the lamination process the display panel can be stretched to the desired 3D position, and meanwhile the stress/strain near the pixel driver chips 150 inside the display panel can still be relaxed.

Figure 22:
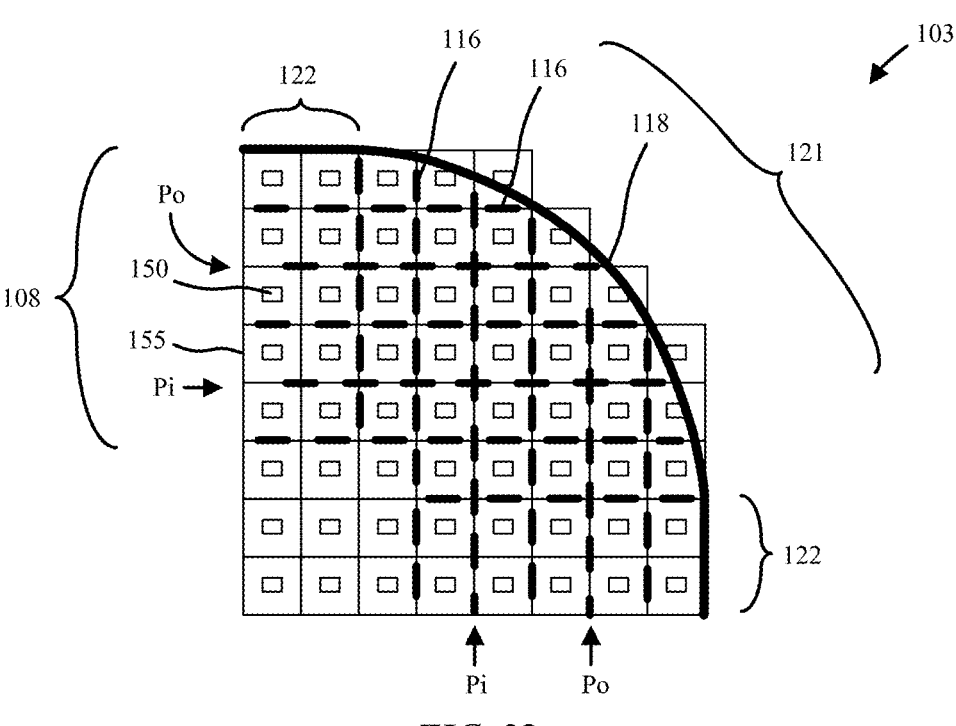
FIG. 22 is a schematic top view illustration of a display structure edge area with square matrix tiles and orthogonal trench design in accordance with an embodiment.

Referring now to FIG. 22 a schematic top view illustration is provided of a display structure edge area with square matrix tiles 155 and an orthogonal trench 116 design in accordance with an embodiment. As shown, the edge areas 108 may include straight edge areas 122 and rounded edge areas 121. For example, extensions of straight edge areas 122 may optionally intersect at rounded edge areas 121, with amount of overlap depending upon the angle of curvature and width of the edge area. In an embodiment, the trenches 116 are formed in dashed trench lines. Thus, the trenches are not continuous in a linear direction. In the particular embodiment illustrated, the dashed trench 116 lines are formed between the matrix tiles 155, though this is not required. As shown, the dashed trench 116 lines may include outside perimeters (Po) that surround (and are offset from) inside perimeters (Pi) of dashed trench 116 lines. By offset, the trenches of adjacent trench lines may be spatially offset in direction from center to edge of the display panel 103. As shown, every other trench line (e.g. even numbers) is aligned, with intermediate lines (e.g. odd numbers) being offset and aligned with one another. In the illustrated embodiment, the dashed trench 116 lines may be parallel to adjacent straight edge areas 122. In the particular embodiment illustrated in FIG. 22, the perimeters of dashed trench 116 lines can intersect one another. For example, orthogonal dashed trench 116 lines can intersect one another in a rounded edge area 121.

Figure 23:
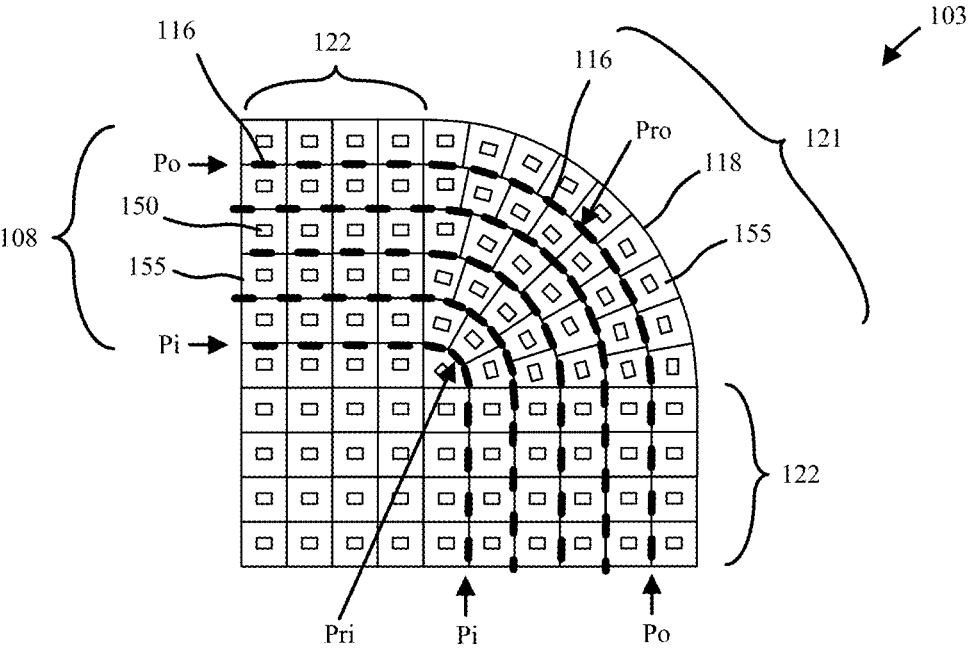
FIGS. 23-24 are a schematic top view illustrations of display structure edge areas with fan-style matrix tiles and a rounded trench designs in accordance with embodiments.

The outside perimeter (Po) and inside perimeter (Pi) of dashed trench 116 lines can also be continuous in the rounded edge area 121 as illustrated in FIG. 23. As shown, the inside perimeters (Pi) and outside perimeters (Po) of dashed trench 116 lines along the straight edge areas 122 are aligned with the rounded inside perimeter (Pri) and the rounded outside perimeter (Pro), respectively, in the rounded edge areas 121 to form curved paths, which may have a substantially similar offset as the matrix tile 155 width/pitch. Thus, the rounded perimeters of dashed trench 116 lines in the rounded edge area 121 may be extension of the perimeters of dashed trench 116 lines from the straight edge areas 122. This may be facilitated in particular by a fan-style matrix tiles 155 configuration to allow for the rounded trench 116 design. Specifically, a fan-style matrix tile 155 design may include rectangular matrix tiles 155 along straight edge areas 122, and a fan-out of non-rectangular matrix tiles 155 along the rounded edge areas 121. The non-rectangular matrix tiles 155 may have a plurality of shapes and areas that are different from one another. Additionally, within an interior row a boundary between adjacent matrix tiles 155 may intersect a single matrix tile 155 of an outer (or inner) row of matrix tiles 155. Thus, the boundaries between adjacent matrix tiles 155 is not necessarily consistent in the rounded edge areas 121, while it may be a consistent pitch within a straight edge area 122. In an embodiment, area of matrix tiles 155 increases radially outward within a rounded edge area 121.

In an embodiment, a display panel 103 includes a first array of pixel driver chip 150 coupled to a first subgroup of LEDs 104 in the matrix of LEDs in the main body area 102, and a second array of second pixel driver chips 150 coupled to a second subgroup of LEDs 104 in the matrix of LEDs in the edge area 108. In an embodiment, the first array of pixel driver chips 150 is positioned in a first grid with a first repeating x-y pixel driver chip 150 pitch (e.g. between straight edge areas 122), and the second array of second pixel driver chips 150 is positioned in a second arrangement that fans out from the first repeating x-y pixel driver pitch (e.g. in the rounded edge area 121).

In some embodiments, a combination of orthogonal and rounded or diagonal trench 116 patterns can be provided. For example, in the embodiment illustrated in FIG. 28, the display structure edge area can include square matrix tiles 155 with a combined orthogonal and diagonal trench 116 design to provide sufficient patterning to accommodate an intended amount of stretchability of the display panel. In an embodiment, the rounded edge area includes a diagonal perimeter(s) (Pd) of dashed trench 116 lines that are diagonal to the inside and outside perimeter(s) of orthogonal dashed trench 116 lines. There may be multiple line patterns of outer/inner dashed contour lines.

Referring generally to the kirgami pattern variations in FIGS. 22-28, in each of the variations, the edge area 108 can include a straight edge area 122 and a rounded edge area 121 (which can optionally be a rounded corner 119). The straight edge areas 122 can include a first outside perimeter (Po) of dashed trench 116 lines (e.g. nearest edge 118), and first inside perimeter (Pi) of dashed trench 116 lines (e.g. nearer main body area 102). In an embodiment, the first outside perimeter (Po) of dashed trench 116 lines is offset (i.e. the trenches 116 are offset) from the first inside perimeter (Pi) of dashed trench lines as previously described.

Referring to FIG. 22 the first inside perimeter (Pi) of dashed trench 116 lines can intersect the second inside perimeter (Pi) of dashed trench lines (e.g. orthogonal to the first inside perimeter of dashed trench 116 lines) in the rounded edge area 121.

Figure 24:
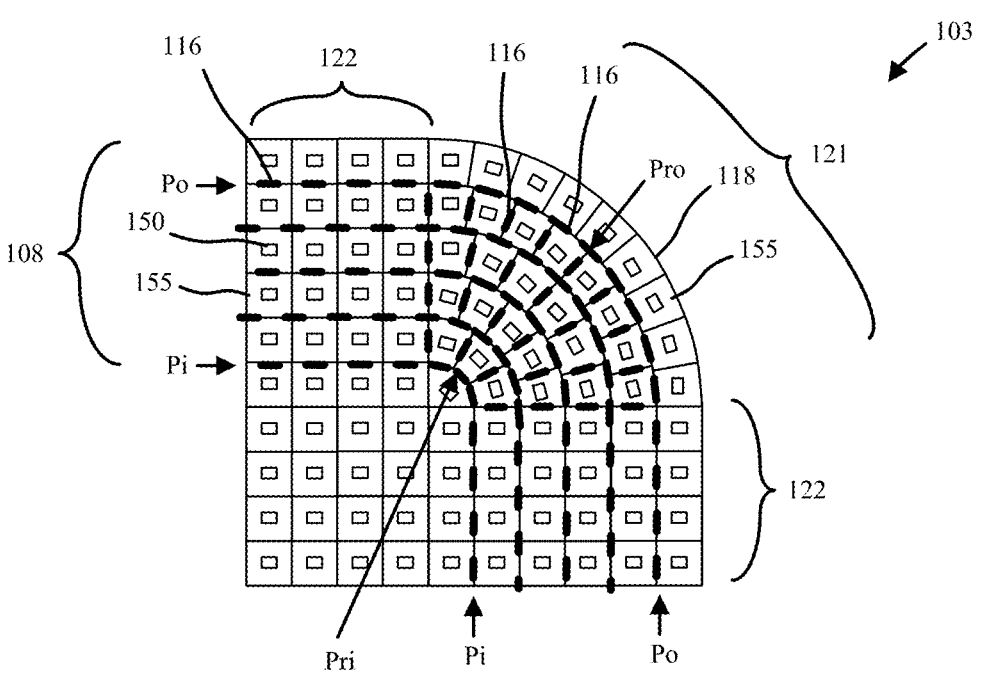

Referring to FIGS. 23-24, the rounded edge area 121 may include a rounded outside perimeter (Pro) of dashed trench 116 lines, and a rounded inside perimeter (Pri) of dashed trench 116 lines. The rounded outside perimeter (Pro) contour of dashed trench 116 lines may be aligned with the first outside perimeter (Po) of dashed trench 116 lines (in straight edge area 122) and the second outside perimeter (Po) of dashed trench 116 lines (in the second, orthogonal straight edge area 122). Thus, the rounded perimeters of dashed trench 116 lines in the rounded edge area 121 may be extension of the perimeters of dashed trench 116 lines from the straight edge areas 122. Additionally, the rounded inside perimeter (Pri) contour of dashed trench lines is aligned with the first inside perimeter (Pi) of dashed trench lines 116 (in straight edge area 122) and the second inside perimeter (Pi) of dashed trench 116 lines (in the second, orthogonal straight edge area 122).

In particular, the embodiment illustrated in FIG. 23 includes only the perimeters of dashed trench 116 lines arranged in the circumferential direction. In the embodiment illustrated in FIG. 24, patterns of dashed trench 116 lines are also shown in the radial direction (e.g. between fan-out pixel tiles 155) as well as circumferential direction (e.g. also between fan-out pixel tiles 155), since the stretching strain in a 3D corner could be in bi-axial tensile strain state. In this embodiment, the trench 116 pattern may relax the strain in both directions.

Figure 25:
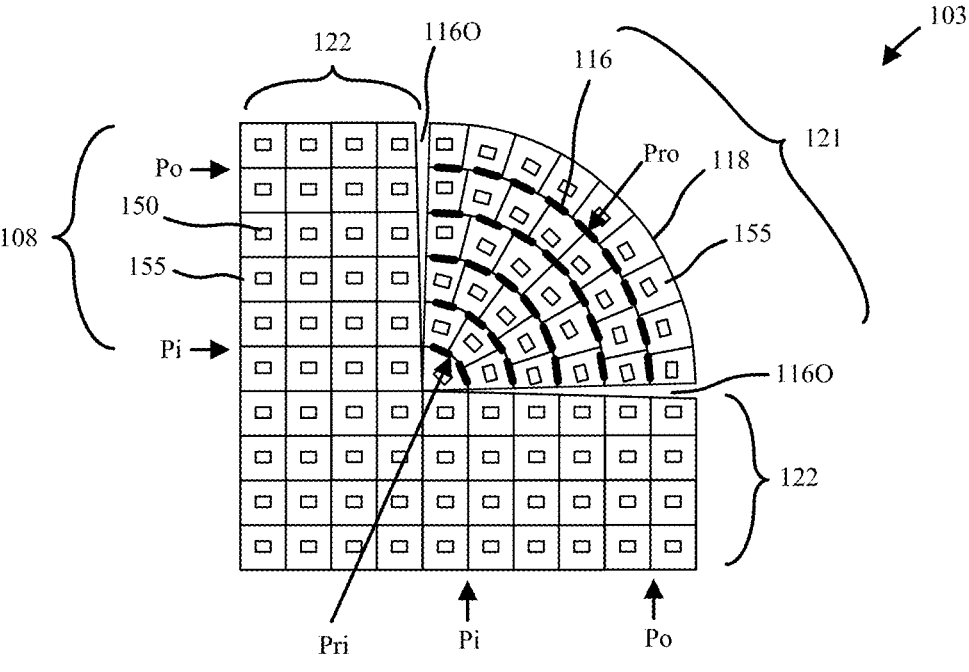
FIG. 25 is a schematic top view illustration of a display structure edge area with orthogonal trenches separating straight and rounded edge areas and rounded trench designs in accordance with an embodiment.

FIG. 25 is a schematic top view illustration of a display structure edge area with orthogonal trenches 1160 separating straight edge areas 122 and rounded edge areas 121 and rounded trench 116 designs in accordance with an embodiment. As shown, orthogonal trenches 1160 create a discontinuous panel, where the smaller rounded edge areas 121 (corners) are to be stretched. The straight edge areas 122 may not require trenches 116, and be folded normally without stretching.

Figure 26:
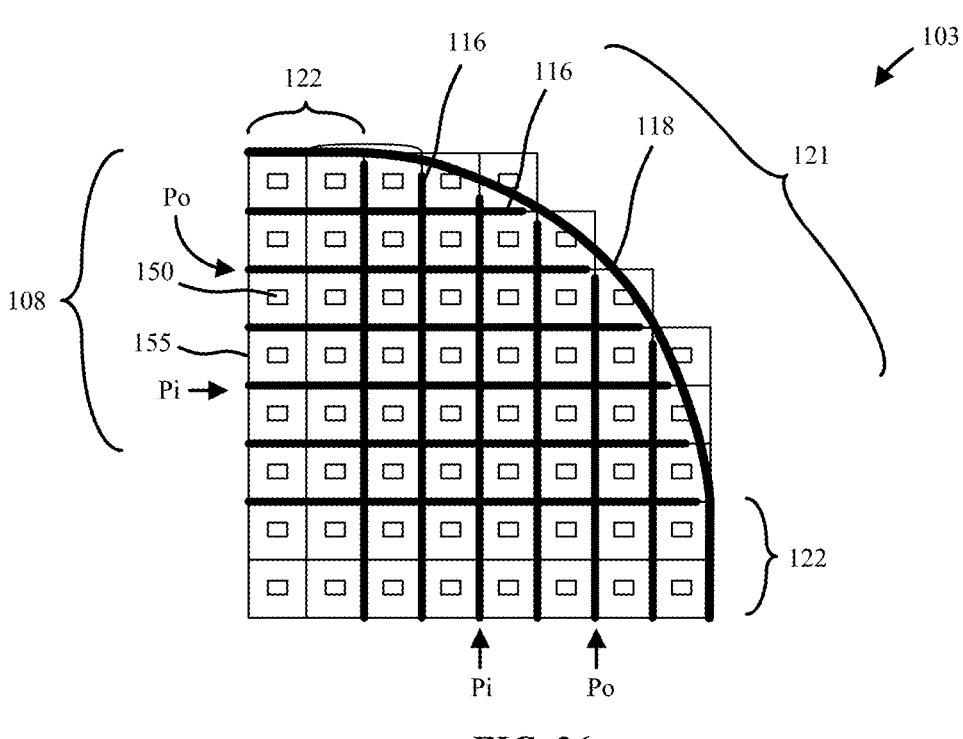
FIG. 26 is a schematic top view illustration of a display structure edge area with square matrix tiles and orthogonal shallow trench design in accordance with an embodiment.

Referring now to FIG. 26 a schematic top view illustration of a display structure edge area with square matrix tiles and orthogonal shallow trench 116 design in accordance with an embodiment. In particular, the embodiment illustrated in FIG. 26 may correspond to trench 116 designs that do not extend into the RDL 140, or only partially into the RDL 140 such that there is no metal routing layer constraint. For exemplary purposes reference is made to at least FIGS. 15-16 where RDL 140 is formed over the decoupling layer 210. In such an exemplary configuration, trench 116 kirigami pattern design has more flexibility. As such, the trenches 116 can be continuous, overlapping between fan-out pixel tiles 155.

Figure 27:
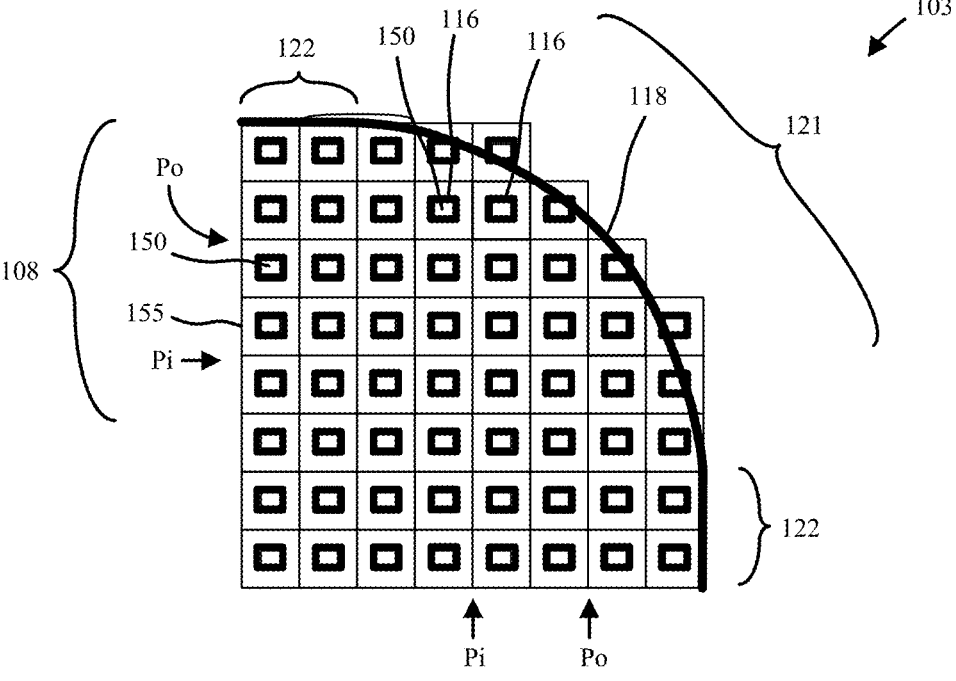
FIG. 27 is a schematic top view illustration of a display structure edge area with trenches and decoupling material adjacent pixel driver chip edges in accordance with an embodiment.

FIG. 27 is a schematic top view illustration of a display structure edge area with trenches 116 and decoupling material adjacent pixel driver chip 150 edges in accordance with an embodiment. In particular, FIG. 27 is a top view illustration of the trench 1116 design described and illustrated with regard to FIG. 16 in order to mechanically isolate the pixel driver chips 150 from the display panel. As shown the trenches 116 can be separate trenches, each directly adjacent and completely surrounding a perimeter of a corresponding pixel driver chip 150. The trenches 116 can also overlap, such as with FIG. 26.

Figures 28, 29, 30:
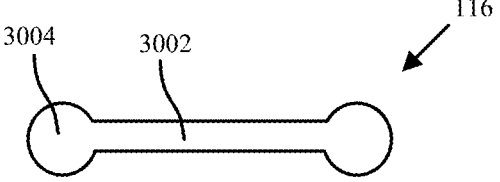
FIG. 28 is a schematic top view illustration of a display structure edge area with square matrix tiles and combined orthogonal and diagonal trench design in accordance with an embodiment.
FIG. 29 is a schematic top view illustration of a display structure edge area illustrating backplane stretchability induced by the trench designs in accordance with embodiment.
FIG. 30 is a schematic top view illustration of a trench design with fillet ends to mitigate stress concentration in accordance with an embodiment.

Referring to FIG. 28, the rounded edge area 121 can include a diagonal outside perimeter (Pd) of dashed trench 116 lines that are diagonal to the first outside perimeter (Po) of dashed trench 116 lines (in straight edge area 122) and the second outside perimeter (Po) of dashed trench lines (in the second, orthogonal straight edge area 122). Additionally, a diagonal inside perimeter (Pd) of dashed trench 116 lines may be diagonal to the first inside perimeter (Pi) of dashed trench 116 lines (in straight edge area 122) and the second inside perimeter (Pi) of dashed trench lines (in the second, orthogonal straight edge area 122).

Up until this point various close-up top view illustrations have been provided of rounded edge areas 121 of a display panel where the edges 118 of the 2D display panel 103 are illustrated as being curved similarly as with regard to the 2D illustration of FIG. 1, and 3D illustration of FIG. 2. However, this is not a necessity, and stretching of the 2D display panel 103 into a curved 3D configuration such as that illustrated in FIG. 2 may result in elongating specific areas of the display panel. For example, as shown in FIG. 29, the edge 118 of the display panel 103 may have a different contour in 2D than in the final 3D product. In the illustrated example, the edge 118 includes a concave contour in 2D that can be stretched into a convex counter in 3D.

The trenches 116 in accordance with embodiments can be made into a variety of shapes. As previously described the trenches 116 can be formed with straight or tapered sidewalls 117. From a top view, the trenches can be straight lines (including dashed lines), curved, etc. in the embodiment illustrated in FIG. 30, the trenches 116 can include an elongated central portion 3002 and fillet ends 3004, which can be rounded to mitigate stress concentrations.

Figure 31:
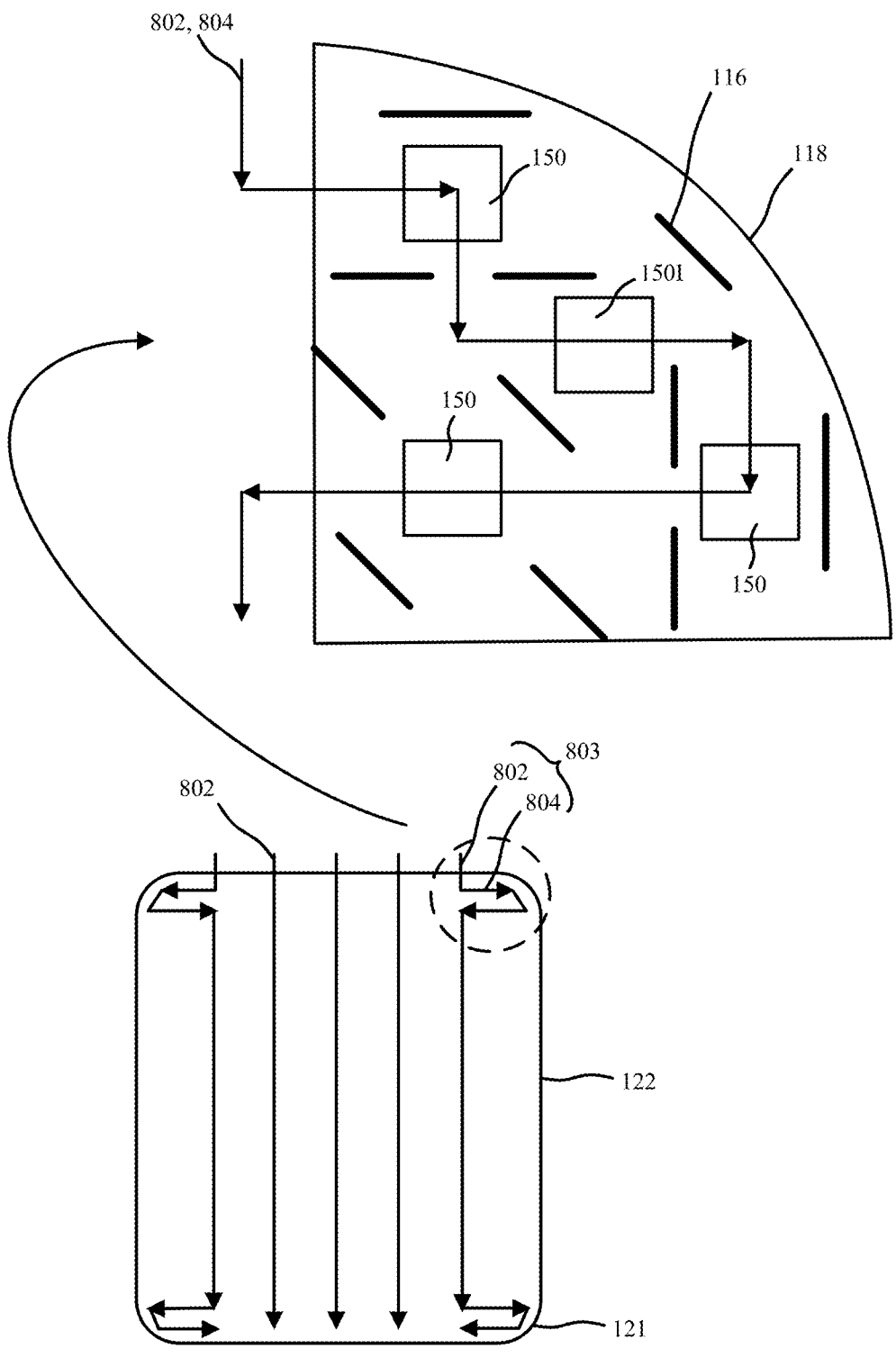
FIG. 31 is a schematic top view illustration of a global routing path navigating through a corner trench design and connecting corner matrix tile pixel driver chips in accordance with an embodiment.

Referring now to FIG. 31 a schematic top view illustration is provided of a global routing path navigating through a corner trench design and connecting corner matrix tile pixel driver chips 150 in accordance with an embodiment. In the illustrated embodiment, the global routing path 803 may be a combination of global routing lines 802 or row lines 804 as previously described that can be modified to form a looping pattern. As shown, global routing lines 802 can run column-wise down the display panel through the main body area 102 as described and illustrated with regard to FIG. 8A. In order to service the rounded edge areas 121, the global routing path 803 may loop in and out of the rounded edge areas 121. This may be facilitated by additionally relocating one or more interstitial pixel driver chips 1501, which are outside of the regular array of pixel driver chips 150. For example, the interstitial pixel driver chips 1501 can be located between the regular array of rows and/or columns of pixel driver chips 150. This can also be achieved using fan-out pixel tiles 155.

In an embodiment, a display structure 110 includes a first global routing line 802 connected to a column of pixel driver chips 150 in the first array of first pixel driver chips in the main body area 102, and a second global routing path 803 that is connected to a group of the second pixel driver chips 150, 1501 in the edge area 108 (e.g. rounded edge area 121), where the second global routing path loops in and out of the edge area 108.

Figure 32:
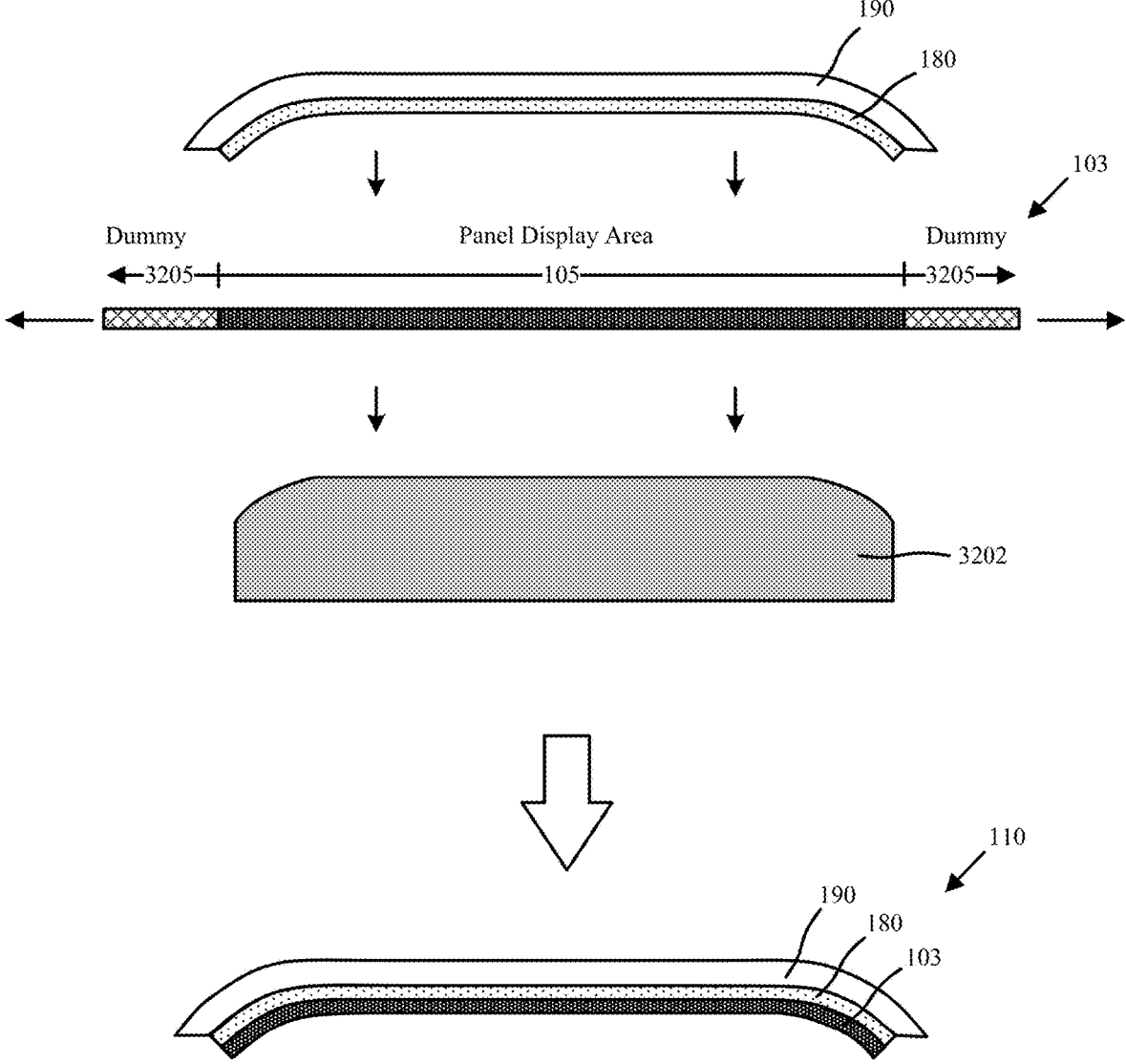
FIG. 32 is a display structure assembly sequence including stretching a display panel with dummy edge areas in accordance with an embodiment.

Referring now to FIG. 32 a display structure 110 assembly sequence is illustrated in which a display panel 103 with dummy edge areas 3205 is stretched during lamination to form a bent 3D film contour in accordance with an embodiment. As shown, the dummy edge areas 3205 can be pulled outward to stretch the display panel 103 while laminating onto a curved bottom mold 3202. Pulling may be performed by physically clamping the dummy edge areas 3205.

Simultaneously, or sequentially, a stack including a thermoformed coverfilm 190 and adhesive layer 180 can be laminated on top of the display panel 103. For example, a rigid coverfilm 190 may provide structural support for the molded display panel 103. The laminated display panel 103 can then be removed from the bottom mold 3202 and trimmed (e.g. laser trimmed) to remove the dummy edge areas 3205.

Figure 33:
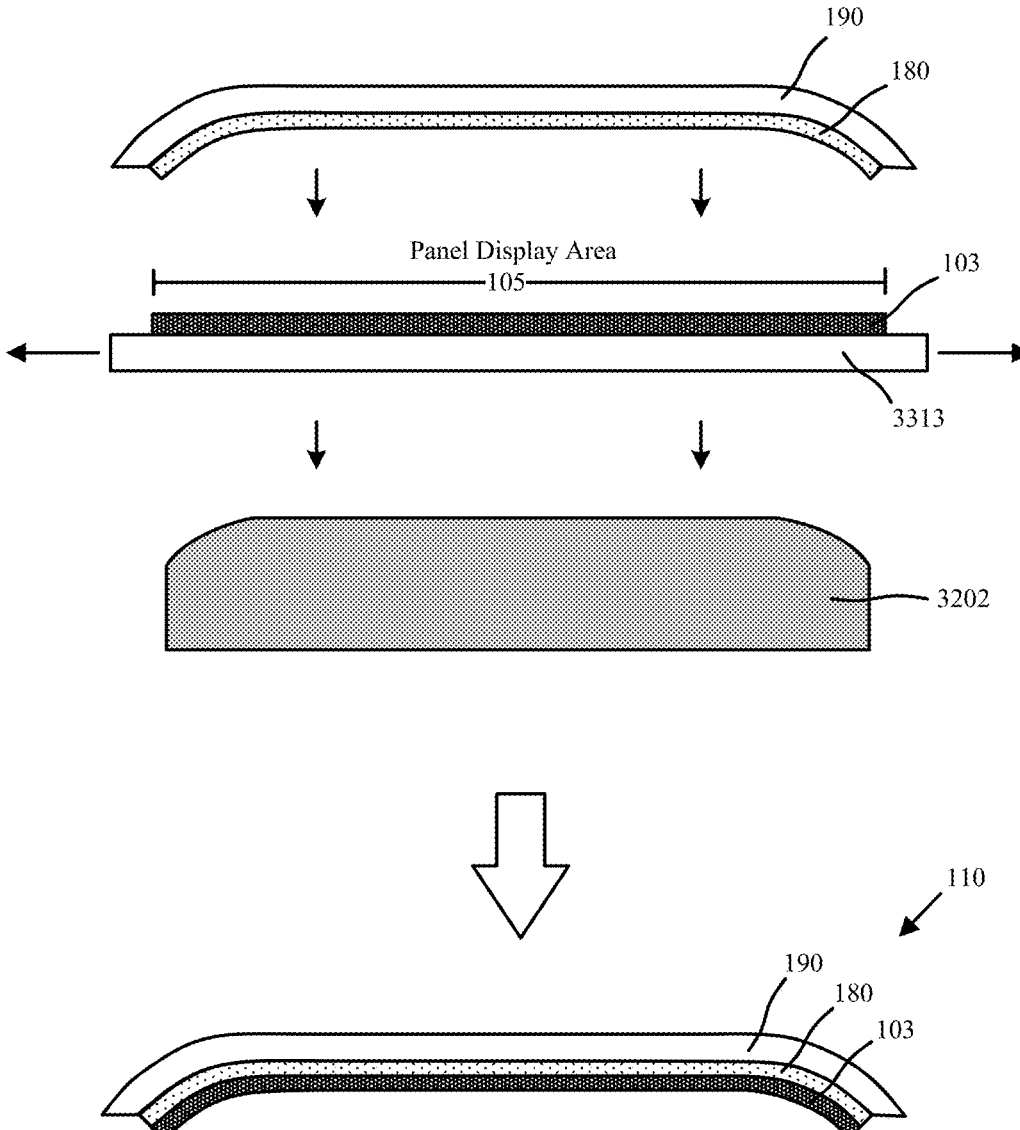
FIG. 33 is a display structure assembly sequence including stretching a carrier substrate carrying a display panel in accordance with an embodiment.

An alternative display structure 110 assembly sequence is illustrated in FIG. 33, which differs from that of FIG. 32 that rather than including dummy edge areas, the display panel 103 can first be laminated onto an oversized carrier film 3313, which instead can be clamped and pulled to stretch the display panel 103 during lamination onto the bottom mold 3202. After bending into the curved 3D film contour during lamination, the laminated display panel 103 can be removed from the bottom mold 3202, followed by removal of the carrier film 3313.

Figure 34:
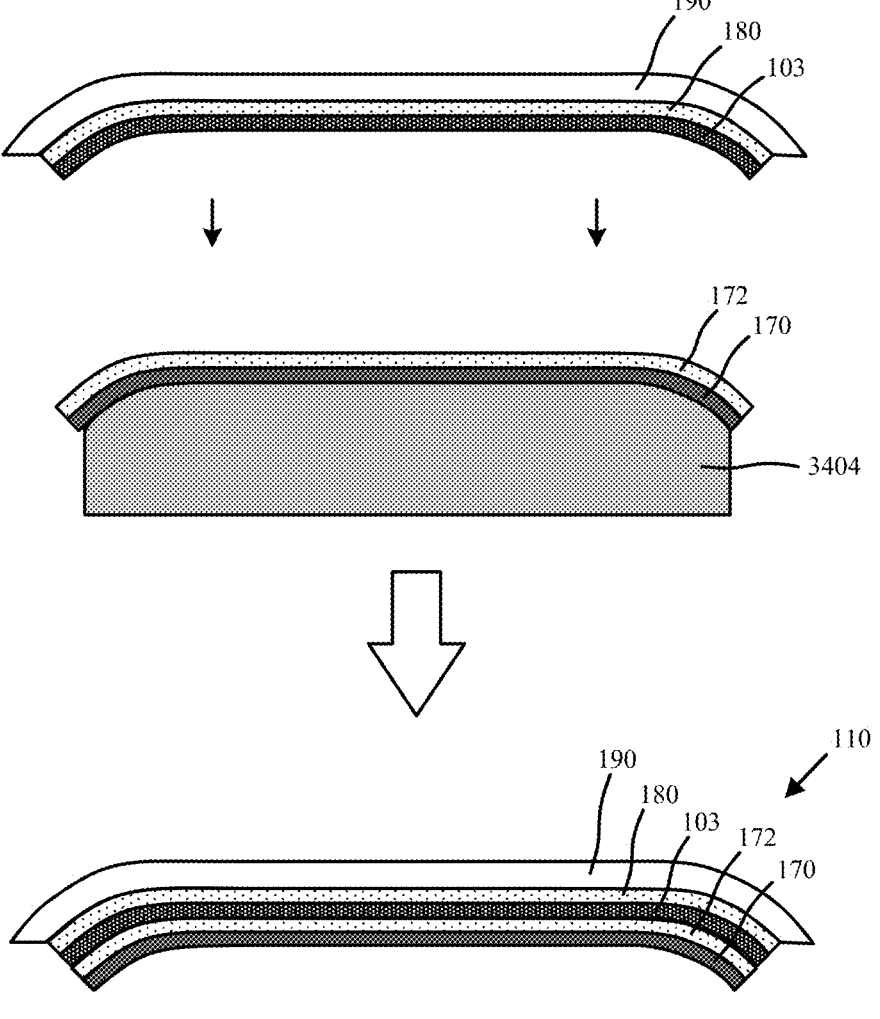
FIG. 34 is a display structure assembly sequence including attachment of a backfilm in accordance with an embodiment.

In some embodiments, the display structure 110 including the molded display panel 103 and top coverfilm 190 can then be further processed to add a backfilm 170. As shown in FIG. 34, a backfilm 170 and adhesive layer 172 can be laminated onto a second bottom mold 3404 along with the display structures 110 of FIG. 21 or 22, followed by removal from the second bottom mold 3404. In some embodiments, the backfilm 170 may help hold the already molded display panel 103 and coverglass 190 stackup in place to mitigate the potential for relaxation or deformation of the molded 3D film contour.

It is to be appreciated that the above assembly sequences are illustrative, and embodiments are not limited to these specific assembly sequences.

The current display structures 110 and assembly sequences can be compatible with existing chip on film (COF) and chip on glass (COG) assemblies in which a flex circuit is attached to a driver ledge of the display panel for electrical connection with various additional system components, such as a timing controller (TCON), sensor controller, power supply, etc. Typically, such a flex circuit connection would be attached to a top side of the display panel 103, or top side of the backplane 145. In addition to being compatible with existing COF and COG attachments, embodiments are also compatible with backside attachment of system components.

Figure 35:
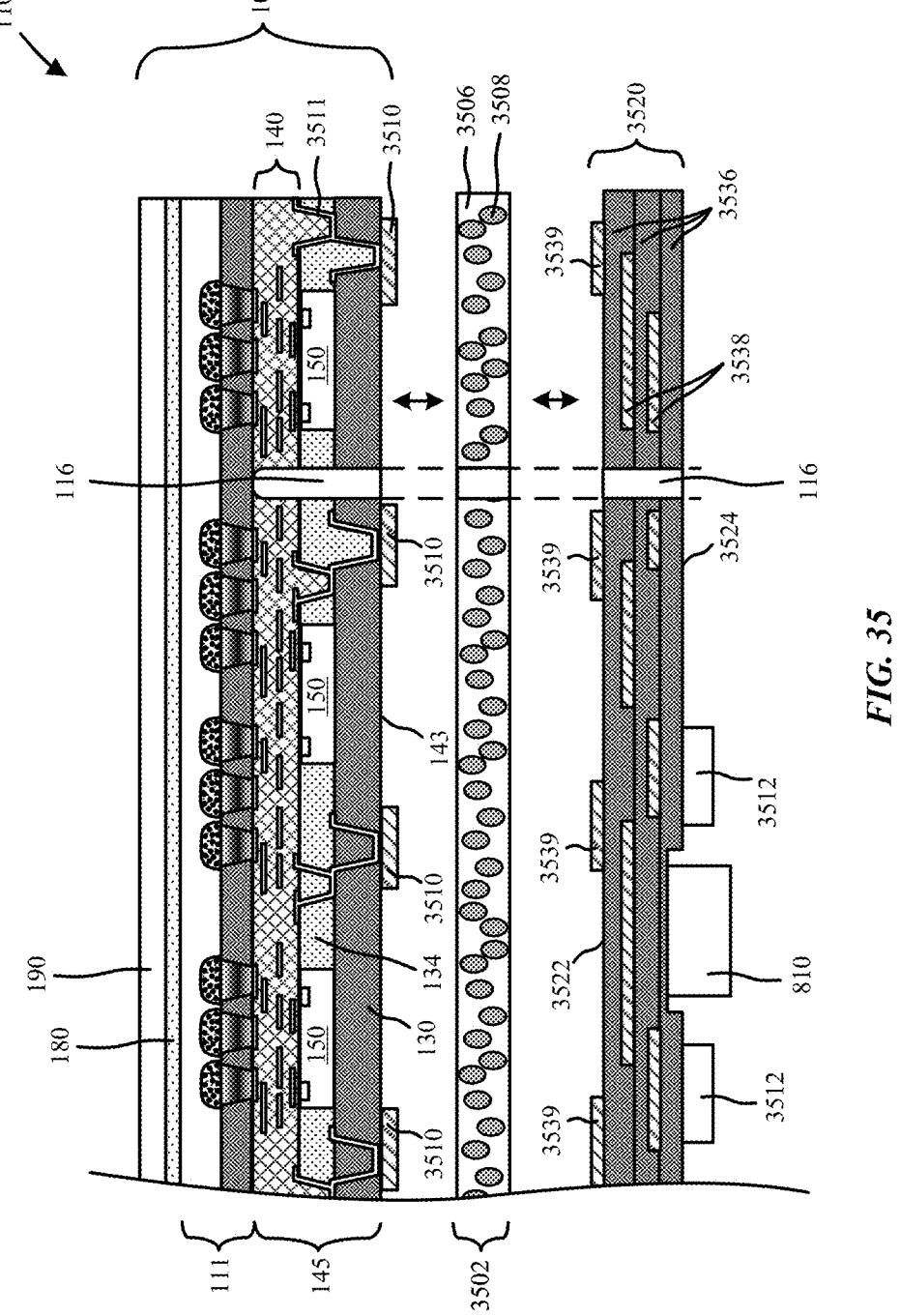
FIG. 35 is a schematic cross-sectional side view illustration of a display structure with backside connection in accordance with an embodiment.

FIG. 35 is a schematic cross-sectional side view illustration of a portion of a display structure 110 with backside connection in accordance with an embodiment. Specifically, FIG. 35 illustrates a backside connection of flex circuit 3520 spanning an edge area 108 including trenches 116 and into a main body area 102 of a display panel 103. While illustrated as flat, it is to be appreciated that the display panel 103 and flex circuit 3520 can be curved, for example along edge area 108. The flex circuit 3520 may be applied to the backplane 145 prior to the formation of trenches 116, with trenches then being formed through both the flex circuit 3520 and backplane 145. This may be followed by molding into 3D film contours as previously described.

Alternatively, the flex circuit can include preformed trenches 116 and be applied after molding of the backplane 145 into the 3D film contour shape.

In accordance with embodiments, the flex circuit 3520 may span entirely or substantially across a width of the backplane 145 such that the flex circuit 3520 spans across laterally opposite edge areas 108 and the main body area 102 therebetween. Alternatively, the flex circuit 3520 may be span only a single edge area 108 and a portion of the main body area 102.

The flex circuit 3520 may be similar to traditional flex connections, including a plurality of wiring layers 3538 dielectric layers 3536 formed of suitable materials. A plurality of additional components can be mounted on the bottom side 3524 of the flex circuit 3520, such as a control circuit 810 (e.g. timing control circuit) or additional components 3512 including sensor controller, power supply, etc.

As shown, a top side 3522 of the flex circuit 3520 can include contact pads 3539 for connection with the display panel 103. In particular, electrical interconnects 3511 may extend between the RDL 140 and a back side 143 of the backplane 145 or underlying portion of the display panel 103 where back side contact pads 3510 are located. In the illustrated embodiment the electrical interconnects 3511 can extend through the passivation layer 134 and carrier layer 130. In an embodiment, the back side contact pads 3510 are connected to a back side of the pixel driver chips 150, or can be back side contact pads 3510 of the pixel driver chips 150.

Electrical connection with flex circuit 3520 contact pads 3539 and back side contact pads 3510 can be accomplished using techniques such as solder bonding, or metal-metal fusion bonding, or using one or more anisotropic conductive films (ACFs) 3502. For example, an ACF may include a plurality of conductive particles 3508 dispersed in an adhesive film 3506. Electrical connection can be achieved with application of heat and pressure where the conductive particles 3508 are compressed while the insulating adhesive material is pushed away. In an embodiment, the trenches 116 are formed through the flex circuit 3520 and optional ACF 3502, and into the backplane 145 after attaching the flex circuit 3520 to the backplane 145. This can be followed by molding techniques as previously described to achieve the 3D film curvature. In such embodiments, the flex circuit 3520 can provide additional mechanical support and sealing function to the structure, similar as the previously described backfilm 170. The flex circuit 3520 can alternatively be produced with pre-cut trenches 116, or no trenches, and bonded the backplane 145 during or after molding into 3D film curvature shapes.

In utilizing the various aspects of the embodiments, it would become apparent to one skilled in the art that combinations or variations of the above embodiments are possible for forming a display structure with 3D compound curvature. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display structure comprising:
a display panel including a display area spanning across a main body area and an edge area around the main body area of the display panel;
wherein the display panel includes:
a backplane including light emitting diode (LED) driver circuitry;
an emission layer stack spanning over the backplane, the emission layer stack including a matrix of LEDs dispersed across the display area and electrically connected with the LED driver circuitry; and
a pattern of trenches extending at least partially through the backplane in the edge area of the display panel, where the trenches do not extend past the matrix of LEDs in the emission layer stack.

2. The display structure of claim 1, wherein the edge area is bent into a curved three-dimensional (3D) film contour.

3. The display structure of claim 2, wherein the backplane includes a redistribution layer including a plurality of routing layers and a plurality of dielectric layers.

4. The display structure of claim 3, wherein the backplane includes a plurality of pixel driver chips embedded in a passivation layer.

5. The display structure of claim 4, wherein the pattern of trenches extends completely through the passivation layer.

6. The display structure of claim 5, wherein the pattern of trenches extends at least partially into the redistribution layer.

7. The display structure of claim 6, wherein the redistribution layer includes a plurality of dummy traces aligned with the pattern of trenches.

8. The display structure of claim 4, wherein the backplane includes a carrier layer, and the pattern of trenches extends completely through the carrier layer and the passivation layer.

9. The display structure of claim 8, wherein the backplane includes a decoupling layer over the plurality of pixel driver chips and the passivation layer, and the redistribution layer is over the decoupling layer.

10. The display structure of claim 2, wherein the edge area includes a straight edge area and a rounded edge area.

11. The display structure of claim 10, wherein the straight edge area includes a first outside perimeter of dashed trench lines, and a first inside perimeter of dashed trench lines.

12. The display structure of claim 11, wherein the first outside perimeter of dashed trench lines is offset from the first inside perimeter of dashed trench lines.

13. The display structure of claim 11, wherein the straight edge area includes a second outside perimeter of dashed trench lines, and a second inside perimeter of dashed trench lines.

14. The display structure of claim 13, wherein the first inside perimeter of dashed trench lines intersects the second inside perimeter of dashed trench lines in the rounded edge area.

15. The display structure of claim 13:

wherein the rounded edge area includes a rounded outside perimeter of dashed trench lines, and a rounded inside perimeter of dashed trench lines;

wherein the rounded outside perimeter of dashed trench lines is aligned with the first outside perimeter of dashed trench lines and the second outside perimeter of dashed trench lines, and the rounded insider perimeter of dashed trench lines is aligned with the first inside perimeter of dashed trench lines and the second inside perimeter of dashed trench lines.

16. The display structure of claim 13, wherein the rounded edge area includes a diagonal outside perimeter of dashed trench lines that are diagonal to the first outside perimeter of dashed trench lines and the second outside perimeter of dashed trench lines, and a diagonal inside perimeter of dashed trench lines that are diagonal to the first inside perimeter of dashed trench lines and the second inside perimeter of dashed trench lines.

17. The display structure of claim 10:

further comprising an orthogonal trench separating the straight edge area and the rounded edge area;

wherein the rounded edge area includes a rounded outside perimeter of dashed trench lines, and a rounded inside perimeter of dashed trench lines.

18. The display structure of claim 17, wherein the backplane includes:

a carrier layer;

a decoupling layer over the carrier layer; and a redistribution layer over the decoupling layer.

19. The display structure of claim 2, wherein the display panel includes a first array of first pixel driver chips coupled to a first subgroup of LEDs in the matrix of LEDs in the main body area, and a second array of second pixel driver chips coupled a second subgroup of LEDs in the matrix of LEDs in the edge area.

20. The display structure of claim 19, wherein:

the first array of first pixel driver chips is positioned in a first grid with a first repeating x-y pixel driver pitch; and the second array of second pixel driver chips is positioned in a second arrangement that fans out from the first repeating x-y pixel driver pitch.

21. The display structure of claim 19, comprising:

a first global routing line connected to a column of pixel driver chips in the first array of first pixel driver chips in the main body area; and a second global routing path that is connected to a group of the second pixel driver chips in the edge area, wherein the second global routing path loops in and out of the edge area.

22. The display structure of claim 2, wherein the trenches are filled with a stretchable material characterized by a stiffness that is less than the backplane.

23. The display structure of claim 2, wherein the pattern of trenches includes a first group of trenches with a first depth, and a second group of trenches with a second depth greater than the first depth.

24. The display structure of claim 23, wherein the second group of trenches is arranged between matrix tiles, each matrix tile including a micro-matrix of LEDs coupled to a pixel driver chip, and the first group of trenches is arranged within the matrix tiles.

25. The display structure of claim 2, wherein the backplane includes:

a carrier layer;

a decoupling layer over the carrier layer; and a redistribution layer over the decoupling layer.

26. The display structure of claim 25, wherein the decoupling layer is formed of a material characterized by an elastic modulus of 1-0.1 MPa.

27. The display structure of claim 25, wherein the decoupling layer extends into the pattern of trenches.

28. The display structure of claim 25, further comprising flexible electrical interconnects extending through the decoupling layer to electrically connect the redistribution layer to a plurality of pixel driver chips.

29. The display structure of claim 25, wherein each trench of the pattern of trenches is a separate trench that surrounds a periphery of a corresponding pixel driver chip of a plurality of pixel driver chips.

* * * * *